(12) United States Patent
Sato

(10) Patent No.: US 7,375,409 B2
(45) Date of Patent: May 20, 2008

(54) SEMICONDUCTOR DEVICE INCLUDING TRANSISTORS HAVING DIFFERENT DRAIN BREAKDOWN VOLTAGES ON A SINGLE SUBSTRATE

(75) Inventor: Yoko Sato, Suwa (JP)

(73) Assignee: Seiko Epson Corporation (JP)

( * ) Notice: Subject to any disclaimer, the term of this patent is extended or adjusted under 35 U.S.C. 154(b) by 70 days.

(21) Appl. No.: 10/892,459

(22) Filed: Jul. 15, 2004

(65) Prior Publication Data
US 2005/0056908 A1    Mar. 17, 2005

(30) Foreign Application Priority Data
Jul. 15, 2003    (JP)    ............... 2003-274551

(51) Int. Cl.
*H01L 27/088*    (2006.01)
(52) U.S. Cl. ............ 257/501; 257/391; 257/392; 257/E27.064
(58) Field of Classification Search ........ 257/390–392, 257/500–502, E27.064
See application file for complete search history.

(56) References Cited

U.S. PATENT DOCUMENTS

| | | | |
|---|---|---|---|
| 5,306,655 A * | 4/1994 | Kurimoto ............... | 438/302 |
| 5,463,238 A * | 10/1995 | Takahashi et al. ....... | 257/351 |
| 5,866,446 A | 2/1999 | Inoh | |
| 6,137,144 A * | 10/2000 | Tsao et al. ............ | 257/357 |
| 6,252,281 B1 * | 6/2001 | Yamamoto et al. ...... | 257/350 |
| 6,314,021 B1 * | 11/2001 | Maeda et al. ........ | 365/185.01 |
| 6,369,410 B1 * | 4/2002 | Yamazaki et al. ....... | 257/72 |
| 6,388,288 B1 * | 5/2002 | Vasanth et al. ......... | 257/344 |
| 6,404,026 B2 | 6/2002 | Tsuyuki | |
| 6,548,874 B1 | 4/2003 | Morton et al. | |
| 6,780,717 B2 | 8/2004 | Yasuoka et al. | |

(Continued)

FOREIGN PATENT DOCUMENTS

JP    09-102586    4/1997

(Continued)

OTHER PUBLICATIONS

"SOI Structure Avoids Increases in Chip Area and Parasitic Capacitance; Enables Operational Control of Transistor Threshold Voltage"; Takashi Ippoushi, Renesas Edge 2004; vol. 5.

*Primary Examiner*—Marcos D. Pizarro
(74) *Attorney, Agent, or Firm*—Harness, Dickey & Pierce, P.L.C.

(57) ABSTRACT

A semiconductor device is provided comprising a supporting substrate, an insulating layer on the substrate, and a first semiconductor layer on the insulating layer. A first high breakdown-voltage transistor is formed in the first semiconductor layer, a second semiconductor layer is formed on the insulating layer and a second high breakdown-voltage transistor is formed in the second semiconductor layer. A first element isolation region reaching the insulating layer is provided between the first and second semiconductor layers. A third semiconductor layer is formed on the insulating layer, a first low breakdown-voltage transistor is formed in the third semiconductor layer, a second low breakdown-voltage transistor is formed in the third semiconductor layer, and a second element isolation region not reaching the insulating layer is formed in the third semiconductor layer between the first and second low breakdown-voltage transistors. The first element isolation region comprises a dual-trench insulating layer.

12 Claims, 23 Drawing Sheets

U.S. PATENT DOCUMENTS

| | | |
|---|---|---|
| 6,876,055 B2 | 4/2005 | Iwata et al. |
| 6,953,979 B1 | 10/2005 | Yamaguchi et al. |
| 6,958,266 B2 | 10/2005 | Yamaguchi et al. |
| 7,224,037 B2 * | 5/2007 | Yasuoka et al. ............ 257/501 |
| 2003/0104671 A1 | 6/2003 | Yasuoka et al. |
| 2003/0127694 A1 | 7/2003 | Morton et al. |
| 2005/0156242 A1 | 7/2005 | Yamaguchi et al. |
| 2007/0096247 A1 | 5/2007 | Yasuoka et al. |

FOREIGN PATENT DOCUMENTS

| | | |
|---|---|---|
| JP | 09-306924 | 11/1997 |
| JP | 2000-243973 | 9/2000 |
| JP | 2001-007219 | 1/2001 |
| JP | 2001-168210 | 6/2001 |
| JP | 2001-230315 | 8/2001 |
| JP | 2001-250921 | 9/2001 |
| JP | 2002-134627 | 5/2002 |
| JP | 2002-170888 | 6/2002 |
| JP | 2003-069026 | 3/2003 |
| JP | 2004-349353 | 12/2004 |

* cited by examiner

SEMICONDUCTOR DEVICE INCLUDING TRANSISTORS HAVING DIFFERENT DRAIN BREAKDOWN VOLTAGES ON A SINGLE SUBSTRATE

RELATED APPLICATIONS

This application claims priority to Japanese Patent Application No. 2003-274551 filed Jul. 15, 2003 which is hereby expressly incorporated by reference herein in its entirety.

BACKGROUND

1. Field of the Invention

The present invention relates to a semiconductor device and a manufacturing method thereof. The semiconductor device is equipped with MOS (Metal Oxide Semiconductor) transistors having different drain breakdown-voltages on a single SOI (Silicon On Insulator) substrate.

2. Related Art

In recent years, as weight savings and miniaturization of mobile electronic devices has been advanced, shrinkage of ICs for such electronic devices must be achieved. Especially for electronic devices equipped with liquid crystal displays, technologies for shrinking the area of IC chips for driving the displays by mounting low breakdown-voltage transistors for low voltage operations and high breakdown-voltage transistors for high voltage operations on single substrates (single chips) are strongly desired. Furthermore, in order to suppress costs, it is also desired to commonly use as much of the process for forming one of the low or high breakdown-voltage transistors in the process for forming the other.

However, high breakdown-voltage transistors sharing an element isolation process with low breakdown-voltage transistors need wider element isolation areas to ensure sufficient breakdown-voltages and further guard rings with high concentration diffusion layers or the like, which makes it difficult to reduce the areas of the transistor forming regions. Therefore, if the miniaturization of the low breakdown-voltage transistors is achieved, the areas of the high breakdown-voltage transistor forming regions cannot be reduced, thus preventing the areas of the drive IC chips from being dramatically reduced.

Furthermore, if the high breakdown-voltage transistors and the low breakdown-voltage transistors are formed on a single SOI substrate, the structures thereof need to be modified so as to form transistors suitable for the SOI substrate in order to avoid the floating body effect particular to SOI substrates, and accordingly, the design properties obtained from forming transistors on bulk silicon substrates cannot be utilized.

An object of the present invention is to provide a semiconductor device equipped with high breakdown-voltage transistors and low breakdown-voltage transistors on a single substrate and especially capable of reducing the areas of transistor regions without degrading the breakdown-voltage property thereby achieving miniaturization of the semiconductor device as a whole as well as avoiding effects particular to the SOI substrates such as a floating body effect in the low breakdown-voltage regions thereby utilizing conventional design properties, and is also to provide a method of manufacturing the above semiconductor device.

SUMMARY

A semiconductor device according to the present invention comprises:
a supporting substrate;
an insulating layer formed on the supporting substrate;
a first semiconductor layer formed on the insulating layer;
a first high breakdown-voltage transistor formed in the first semiconductor layer;
a second semiconductor layer formed on the insulating layer;
a second high breakdown-voltage transistor formed in the second semiconductor layer;
a first element isolation region that reaches the insulating layer and provided between the first semiconductor layer and the second semiconductor layer;
a third semiconductor layer formed on the insulating layer;
a first low breakdown-voltage transistor formed in the third semiconductor layer;
a second low breakdown-voltage transistor formed in the third semiconductor layer; and
a second element isolation region that is offset from the insulating layer and formed in the third semiconductor layer and provided between the first low breakdown-voltage transistor and the second low breakdown-voltage transistor,
wherein the first element isolation region comprises a trench insulating layer having a dual-trench structure.

According to the semiconductor of the present invention, the high breakdown-voltage transistor is formed in a region surrounded by the first element isolation region that is deep enough to reach the insulating layer. Accordingly, since the wider element isolation region necessary for ensuring the required breakdown-voltage property can be eliminated, the area of the high breakdown-voltage transistor region can be reduced. Furthermore, since the element isolation region reaches the insulating layer, the parasitic transistor sometimes formed under the element isolation region can be prevented. Still further, since the guard ring of the high concentration diffusion layer is not necessary, the area of the high breakdown-voltage transistor region can also be reduced. Further, since the low breakdown-voltage transistor is formed in a region surrounded by the second element isolation region that is not deep enough to reach the insulating layer, problems arising from using the SOI substrate, such as a floating body can be eliminated. As a result, even in case of forming the high breakdown-voltage transistor and the low breakdown-voltage transistor on a single substrate, the miniaturization of the semiconductor device can be achieved. Furthermore, the conventional design properties can be utilized for the low breakdown-voltage transistors.

The present invention can be modified, for example, as follows.

The semiconductor device of the present invention further comprises a third element isolation region that reaches the insulating layer and provided between the second semiconductor layer and the third semiconductor layer, wherein the third element isolation region comprises a trench insulating layer having a dual-trench structure.

In the semiconductor device of the present invention, the first semiconductor layer, the second semiconductor layer, and the third semiconductor layer can have equal thicknesses.

In the semiconductor device of the present invention, the equal thicknesses of the first semiconductor layer, the second semiconductor layer, and the third semiconductor layer are between 500 and 2000 nm.

In the semiconductor device of the present invention, surface levels of the first semiconductor layer, the second semiconductor layer, and the third semiconductor layer can be the same.

In the semiconductor device of the present invention, the first and second high breakdown-voltage transistors can further comprise:

a first gate insulating layer formed above a channel region; and a second gate insulating layer formed above an offset region, wherein the thickness of the second gate insulating layer can be greater than the thickness of the first gate insulating layer.

A method of manufacturing a semiconductor device according to the present invention comprises the steps of:

providing a substrate including a supporting substrate, an insulating layer, and a semiconductor layer;

forming a groove section in the semiconductor layer using a mask layer with a first opening;

forming a dual-trench comprising a first trench that reaches the insulating layer and a second trench that is offset from the insulating layer by etching a portion of the semiconductor layer including the groove section using a mask layer with a second opening larger than the first opening;

forming a first semiconductor layer, a second semiconductor layer, and a third semiconductor layer by filling the dual-trench with an insulating layer to form a first element isolation region and a third element isolation region;

forming a second element isolation region in the third semiconductor layer that is offset from the insulating layer;

forming a first high breakdown-voltage transistor in the first semiconductor layer;

forming a second high breakdown-voltage transistor in the second semiconductor layer;

forming a first low breakdown-voltage transistor in the third semiconductor layer; and forming a second low breakdown-voltage transistor across the second element isolation region from the first low breakdown-voltage transistor in the third semiconductor layer.

According to the manufacturing method of a semiconductor device of the present invention, the high breakdown-voltage transistor and the low breakdown-voltage transistor are formed in the semiconductor layer having the same thickness. Since the low breakdown-voltage transistor is formed in a region surrounded by the second element isolation region that is not deep enough to reach the insulating layer, negative effects particular to the SOI substrate such as a floating body effect can be eliminated from the low breakdown-voltage transistor, thus the conventional design properties thereof can be utilized. Furthermore, since the high breakdown-voltage transistor can be formed in the semiconductor layer separated by the first element isolation region, a wider element isolation region is not required, thus the semiconductor device, which is capable of preventing a parasitic transistor that is sometimes formed under the element isolation region, can be manufactured.

The present invention can be modified, for example, as follows.

In the method of manufacturing a semiconductor device according to the present invention, the second element isolation region is formed by a trench element isolation process.

In the method of manufacturing a semiconductor device according to the present invention, the step of forming the dual-trench and the step of forming a trench for the second element isolation region are performed in a single step.

In the method of manufacturing a semiconductor device according to the present invention, the second element isolation region can be formed by the LOCOS process.

In the method of manufacturing a semiconductor device according to the present invention, the second element isolation region can be formed by the semi-recessed LOCOS process.

In the method of manufacturing a semiconductor device according to the present invention, the steps of forming the first and the second high breakdown-voltage transistors can comprise:

forming an offset insulating layer above an offset region; and forming a first gate insulating layer above at least a channel region and the offset region, and wherein a second gate insulating layer having the offset insulating layer and the first gate insulating layer stacked is formed above the offset region.

In the method of manufacturing a semiconductor device according to the present invention, the step of forming the offset insulating layer and the step of forming the second element isolation region can be performed in a single step.

DETAILED DESCRIPTION

Hereinafter, an example of a first embodiment according to the present invention is described.

1. Semiconductor Device

Figure 1:
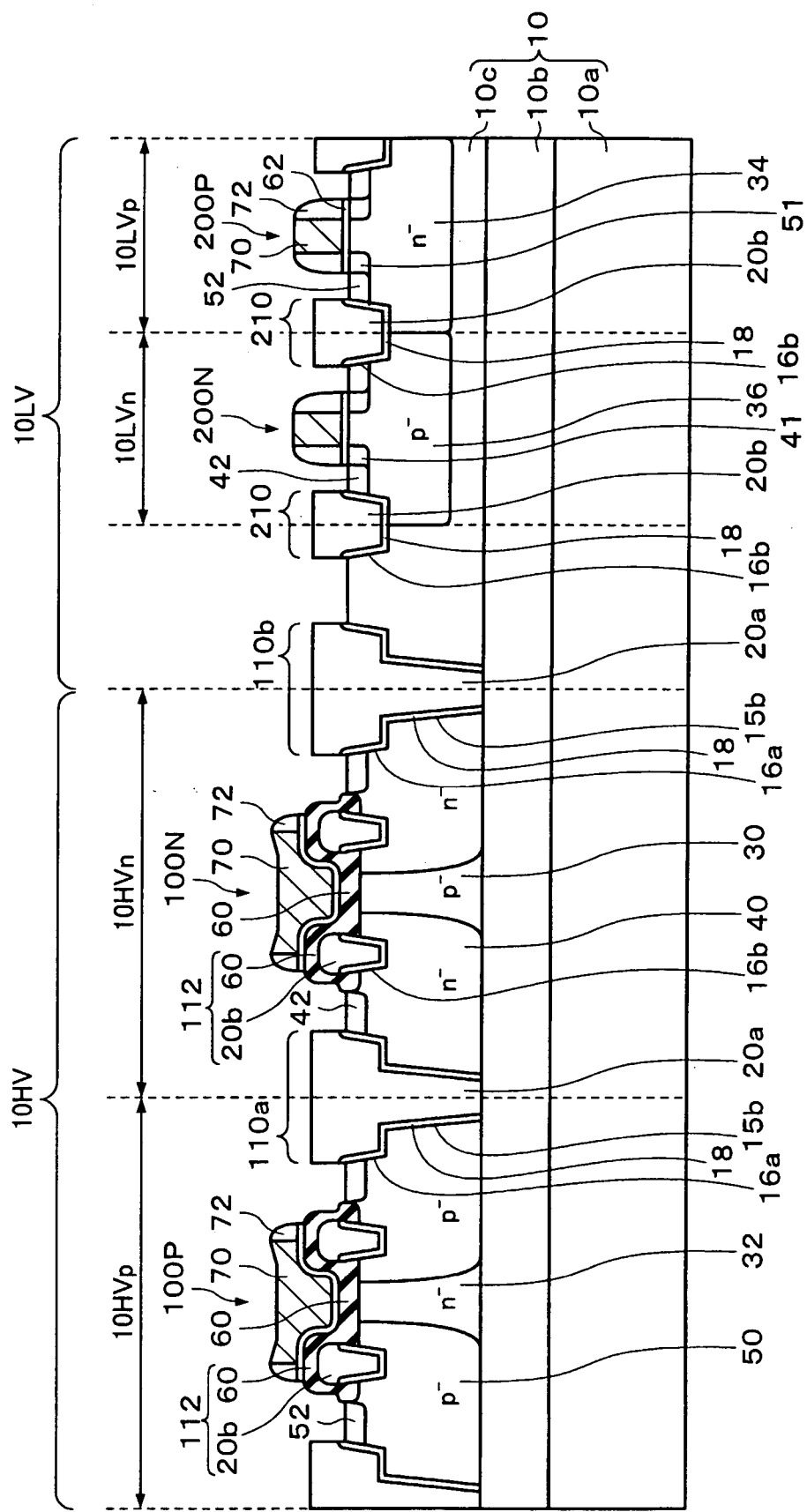
FIG. 1 is a cross-sectional view schematically showing a semiconductor device according to the present embodiment.

FIG. 1 is a cross-sectional view schematically showing a semiconductor device according to the present embodiment. The semiconductor device of the present embodiment comprises an SOI substrate 10 formed by sequentially stacking an insulating layer 10b and a semiconductor layer 10c on a supporting layer 10a. The semiconductor layer is, for example, a monocrystal silicon layer. In the SOI substrate 10 there are provided a high breakdown-voltage transistor region 10HV and a low breakdown-voltage region 10LV. The high breakdown-voltage transistor region comprises a P channel high breakdown-voltage transistor region 10HVp and an N channel high breakdown-voltage transistor region 10HVn. The low breakdown-voltage transistor region comprises a P channel low breakdown-voltage transistor region 10LVp and an N channel low breakdown-voltage transistor region 10LVn. A P channel high breakdown-voltage transistor 100P is formed in the P channel high breakdown-voltage transistor region 10HVp, and an N channel high breakdown-voltage transistor 100N is formed in the N channel high breakdown-voltage transistor region 10HVn. Likewise, a P channel low breakdown-voltage transistor 200P is formed in the P channel low breakdown-voltage transistor region 10LVp, and an N channel low breakdown-voltage transistor 200N is formed in the N channel low breakdown-voltage transistor region 10LVn.

The P channel high breakdown-voltage transistor 100P, the N channel high breakdown-voltage transistor 100N, the P channel low breakdown-voltage transistor 200P, and the N channel low breakdown-voltage transistor 200N are mixedly formed on the single substrate (the single chip). Although only four transistors are illustrated in FIG. 1 for the sake of convenience, it is needless to say that a number of each type of transistors is formed on the single substrate.

Further, the thickness of the semiconductor layer 10c is constant throughout the regions where each of the transistors is formed. Accordingly, since the semiconductor layer 10c is formed above the supporting substrate 10a with a constant thickness and the insulating layer 10b with a constant thickness, the surface levels of the semiconductor layers corresponding to the respective transistor forming regions are the same.

1.1 High Breakdown-Voltage Transistor Region

Firstly, the high breakdown-voltage transistor region 10HV is described. First and third element isolation regions 110a, 110b that are deep enough to reach the insulating layer 10b are formed on the border between the high breakdown-voltage transistor region 10HV and the low breakdown-voltage transistor region 10LV. The third element isolation region 110b separates the high breakdown-voltage transistor region 10HV from the low breakdown-voltage transistor region 10LV. In other words, the high breakdown-voltage transistor region 10HV is surrounded by the third element isolation region 110b having a sufficient depth to reach the insulating layer 10b.

In the high breakdown-voltage transistor region 10HV, there are provided the P channel high breakdown-voltage transistor region 10HVp and the N channel high breakdown-voltage transistor region 10HVn. The first element isolation region 110a having a sufficient depth to reach the insulating layer 10b is provided between the adjacent high breakdown-voltage transistor regions. In other words, between the P channel high breakdown-voltage transistor 100P and the N channel high breakdown-voltage transistor 100N adjacent to each other, there is provided the first element isolation region 110a that is deep enough to reach the insulating layer 10b.

The first and the third element isolation regions comprise a trench insulating layer 20a bedded in a dual trench having a first trench 15b and a second trench 16a. The first trench 15b is formed so that the bottom surface thereof reaches the insulating layer 10b. The second trench 16a has a width greater than that of the first trench 15b, and the depth thereof is the same as a trench 16b that forms a second element isolation region 210 as described below.

Hereinafter, structures of the P channel high breakdown-voltage transistor 100P and the N channel high breakdown-voltage transistor 100N are described.

The P channel high breakdown-voltage transistor 100P comprises a first gate insulating layer 60, a second gate insulating layer 112, a gate electrode 70, a P type low concentration impurity layer 50, a side wall insulating layer 72, and a P type high concentration impurity layer 52.

The first gate insulating layer 60 is provided on an N type well 32 that is to form a channel region. The second gate insulating layer 112 is formed of both edges of the first insulating layer 60 and is positioned above offset regions. Note that the second gate insulating layer 112 denotes a laminated film formed of a trench insulating layer 20b as an offset insulating layer and the first gate insulating layer 60. The gate electrode 70 is formed on at least the first gate insulating layer 60. The P type low concentration impurity layer 50 forms the offset region. The side wall insulating layer 72 is formed on a side surface of the gate electrode 70. The P type high concentration impurity layer 52 is provided outside the side wall insulating layer 72. The P type high concentration impurity layer 52 forms a source region or a drain region (hereinafter referred to as a source/drain region).

The N channel high breakdown-voltage transistor 100N comprises the first gate insulating layer 60, the second gate insulating layer 112, the gate electrode 70, an N type low concentration impurity layer 40, the side wall insulating layer 72, and an N type high concentration impurity layer 42.

The first gate insulating layer 60 is provided on a P type well 30 that is to form the channel region. The second gate insulating layer 112 is formed of both edges of the first insulating layer 60 and is provided above the offset regions. Note that the second gate insulating layer 112 denotes a laminated film formed of the trench insulating layer 20b and the first gate insulating layer 60. The gate electrode 70 is formed on at least the first gate insulating layer 60. The N type low concentration impurity layer 40 forms the offset region. The side wall insulating layer 72 is formed on a side surface of the gate electrode 70. The N type high concentration impurity layer 42 is provided outside the side wall insulating layer 72. The N type high concentration impurity layer 42 forms the source/drain region.

1.2 Low Breakdown-Voltage Region

Firstly, the low breakdown-voltage region 10LV is described. In the low breakdown-voltage region, there are provided the P channel low breakdown-voltage transistor region 10LVp and the N channel low breakdown-voltage transistor region 10LVn. The second element isolation region 210 that is not deep enough to reach the insulating layer 10b is provided between the adjacent low breakdown-voltage transistor regions. In other words, between the P channel low breakdown-voltage transistor 200P and the N channel low breakdown-voltage transistor 200N adjacent to each other, there is provided the second element isolation region 210 that is not deep enough to reach the insulating layer and 10b.

Structures of the respective transistors are hereinafter described.

The N channel low breakdown-voltage transistor 200N comprises the gate insulating layer 62, the gate electrode 70, the side wall insulating layer 72, an N type low concentration impurity layer 41, and the N type high concentration impurity layer 42.

The gate insulating layer 62 is provided on a P type well 36 that is to form the channel region. The gate electrode 70 is formed on the gate insulating layer 62. The side wall insulating layer 72 is formed on a side surface of the gate electrode 70. The N type low concentration impurity layer 41 forms the offset region. The N type high concentration impurity layer 42 is provided outside the side wall insulating layer 72. The N type high concentration impurity layer 42 forms the source/drain region.

The P channel low breakdown-voltage transistor 200P comprises the gate insulating layer 62, the gate electrode 70, the side wall insulating layer 72, a P type low concentration impurity layer 51, and a P type high concentration impurity layer 52.

The gate insulating layer 62 is provided on an N type well 34 that is to form the channel region. The gate electrode 70 is formed on the gate insulating layer 62. The side wall insulating layer 72 is formed on the side surface of the gate electrode 70. The P type low concentration impurity layer 51 forms the offset region. The P type high concentration impurity layer 52 is provided outside the side wall insulating layer 72. The P type high concentration impurity layer 52 forms the source/drain region.

Advantages of the semiconductor device according to the present embodiment are as described below.

In the semiconductor device according to the present embodiment, the high breakdown-voltage transistor region 10HV is surrounded by the third element isolation region 110b that is deep enough to reach the insulating layer 10b. Further, between the adjacent high breakdown-voltage transistor regions, there is provided the first element isolation region 110a having a sufficient depth for reaching the insulating layer 10b. Namely, the high breakdown-voltage transistors 100P and 100N can be formed on a completely separated portion of the semiconductor layer 10c. Accordingly, the parasitic MOS transistors that are sometimes formed under the element isolation regions can be prevented. Furthermore, since the guard ring formed of the wider element isolation region or the high concentration diffusion layer is not necessary, the area of the high breakdown-voltage transistor forming region can be reduced.

Furthermore, in the semiconductor device according to the present embodiment, between the adjacent low breakdown-voltage transistor regions, the second element isolation region 210 that is not deep enough to reach the insulating layer 10b is provided. Therefore, performance of the low breakdown-voltage transistors becomes substantially the same as that of the bulk type MOS transistors, thereby avoiding the negative effects particular to the SOI substrate such as a floating body effect and to utilize conventional design properties.

According to the semiconductor device of the present embodiment, the first and the third element isolation regions 110a, 110b have the dual trench structures in which the second trench 16a having a large upward opening and the first trench 15b having a smaller opening compared to the second trench 16a are combined. By adopting the dual trench structure, compared to the case of forming a trench that is deep enough to reach the insulating layer 10b and has a constant opening width, an etching amount of the semiconductor layer 10c can be reduced, thus reducing the stress applied to the semiconductor layer 10c around the trench.

Figure 2:
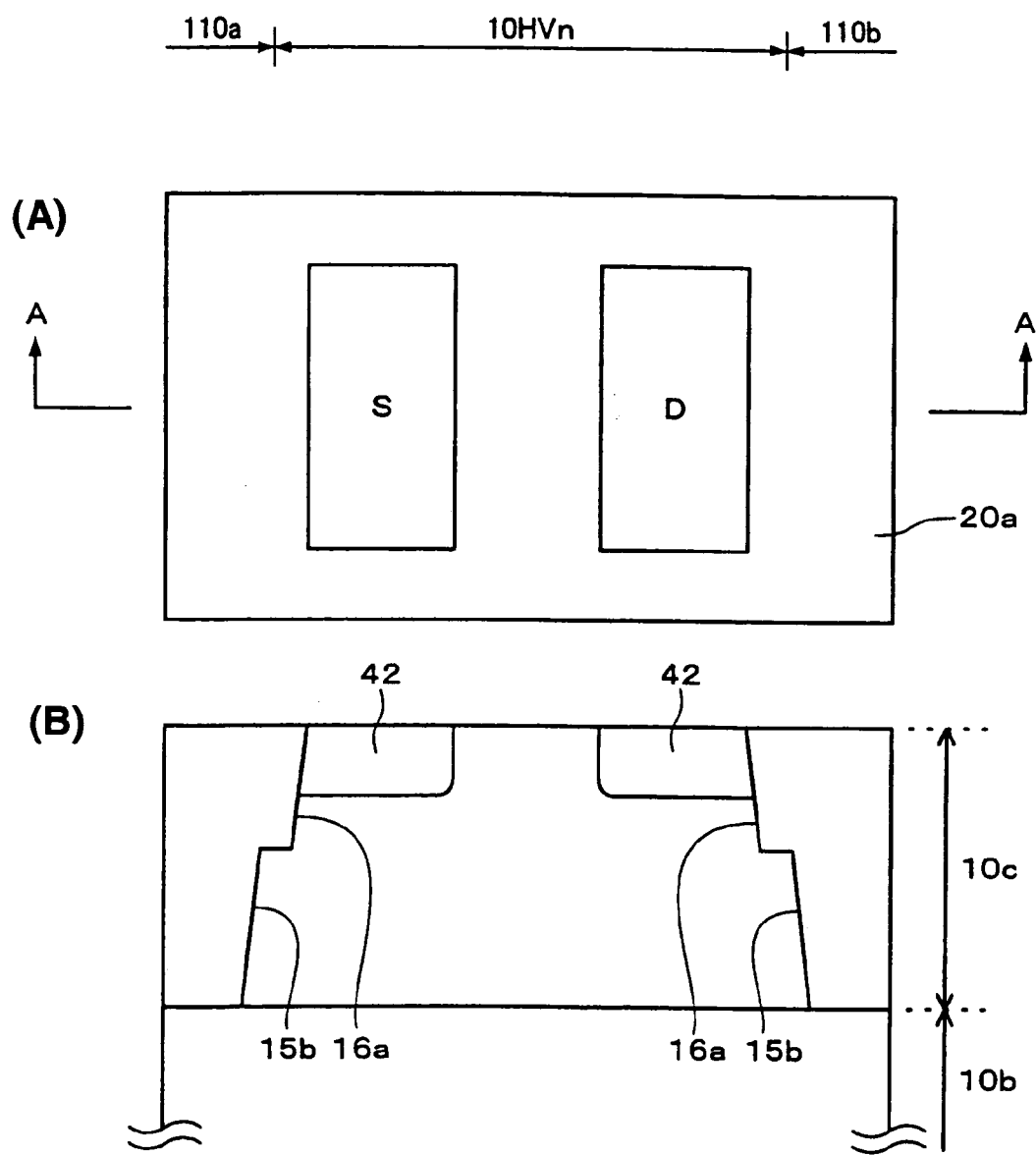
FIG. 2(A) is a plan view schematically showing a part of a semiconductor device according to the present embodiment.
FIG. 2(B) is a cross-sectional view corresponding to FIG. 2(A).
Figure 23:
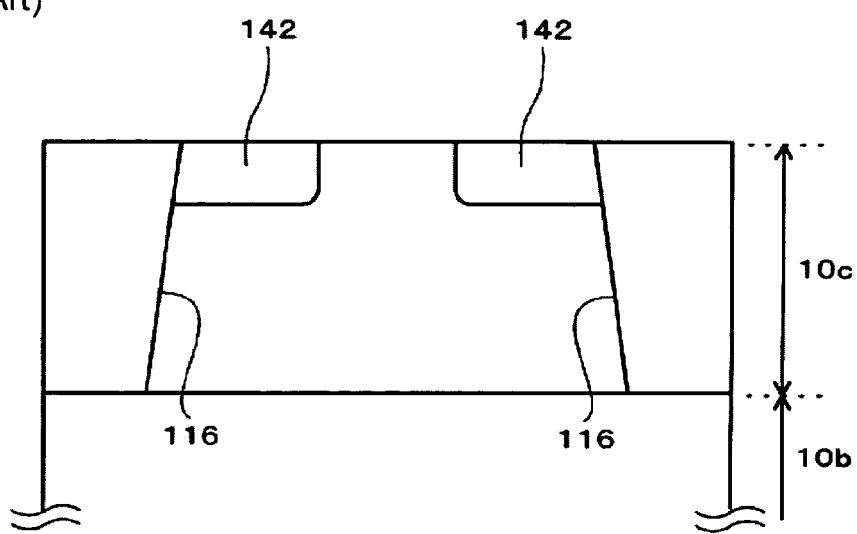
FIG. 23 is cross-sectional view showing the corresponding part of a conventional semiconductor device to the part shown in FIG. 2(B).

The above advantages are further described with reference to FIGS. 2(A), 2(B), and 23. FIG. 2(A) is a plan view schematically showing the physical relationship between the source/drain region 42, the channel region, and the first and the third element isolation regions 110a, 110b of the N channel high breakdown-voltage transistor 100N of the semiconductor device according to the present embodiment. FIG. 2(B) is a cross-sectional view of FIG. 2(A). FIG. 23 is a cross-sectional view showing the corresponding section of the conventional semiconductor device to that shown in FIG. 2(B).

As seen from FIGS. 2(A) and 2(B), the source region 42 and the drain region 42 are surrounded by the second trench 16a. Namely, the source region 42 and the drain region 42 are adjacent to the second trench 16a that is not deep enough to reach the insulating layer 10b. Since a smaller etching amount is required to form the second trench that is not deep enough to reach the insulating layer 10b, the etching damages of the source region 42 and the drain region 42 sometimes caused in the adjacent sections thereof to the second trench 16a can be reduced, and accordingly a leak current can be prevented.

If on the contrary, as shown in FIG. 23, the source region 142 and the drain region 142 are adjacent to the trench 116 which is deep enough to reach the insulating layer 10b, deep etching damages are caused by forming such a deep trench 116, namely the etching damages caused in the adjacent sections are so deep as to make up one of the causes of the leak current.

As described above, according to the semiconductor device of the present embodiment, since the stresses around the junction sections can be reduced, the leak current can be prevented, and accordingly the semiconductor devices having enhanced reliability can be provided.

2. Method of Manufacturing a Semiconductor Device

In the following section a method of manufacturing a semiconductor device according to the present embodiment is described with reference to FIGS. 3 through 22. FIGS. 3 through 22 are cross-sectional views schematically showing the steps of the manufacturing method of the semiconductor device according to the present embodiment.

Figure 3:
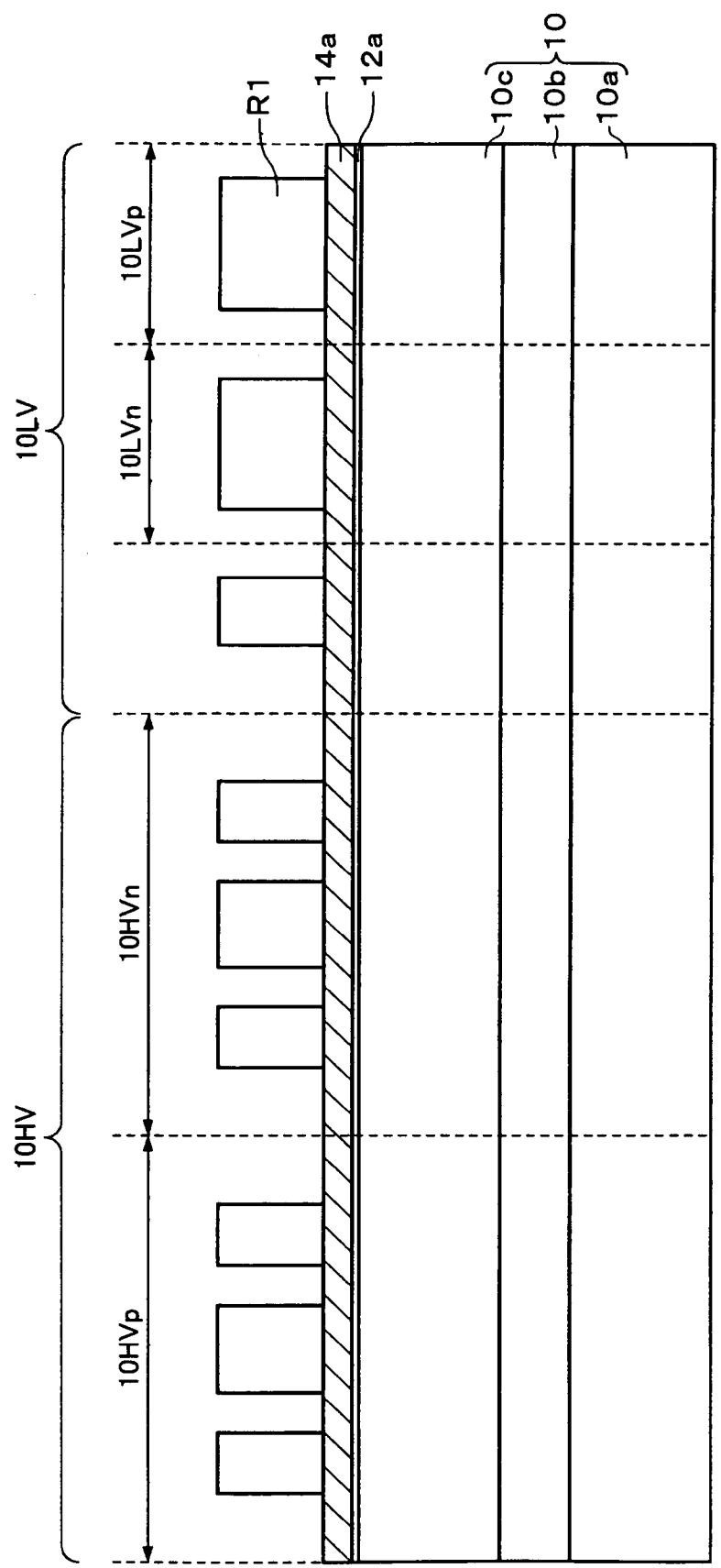
FIG. 3 is a cross-sectional view showing one process of the method of manufacturing the semiconductor device shown in FIG. 1.

(1) The semiconductor device of the present embodiment is, as shown in FIG. 3, formed of the SOI substrate 10 made by stacking the insulating layer 10b and the semiconductor layer 10c on the supporting substrate 10a. A monocrystal silicon layer can be used as the semiconductor layer 10c. The thickness of the monocrystal silicon layer 10c is preferably between 500 and 2000 nm. As shown in FIG. 3, the first insulating layer 12a is formed on the semiconductor layer 10c. A silicon oxide film, a silicon oxynitride film or the like is used as the first insulating layer 12a. The first insulating layer 12a can be formed by, for example, the CVD process.

Subsequently, a stopper insulating layer 14a is formed on the first insulating layer 12a. A silicon nitride film can be formed as the stopper insulating layer 14a. The stopper insulating layer 14a can be formed by the CVD process. A resist layer R1 having a predetermined pattern is subsequently formed on the stopper insulating layer 14a. The resist layer R1 has openings above areas where the first through the third element isolation regions 110a, 210, 110b are formed and the offset regions of the high breakdown-voltage transistors. Namely, the resist layer R1 has openings corresponding to all of the regions where any type of trenches are formed.

Figure 4:
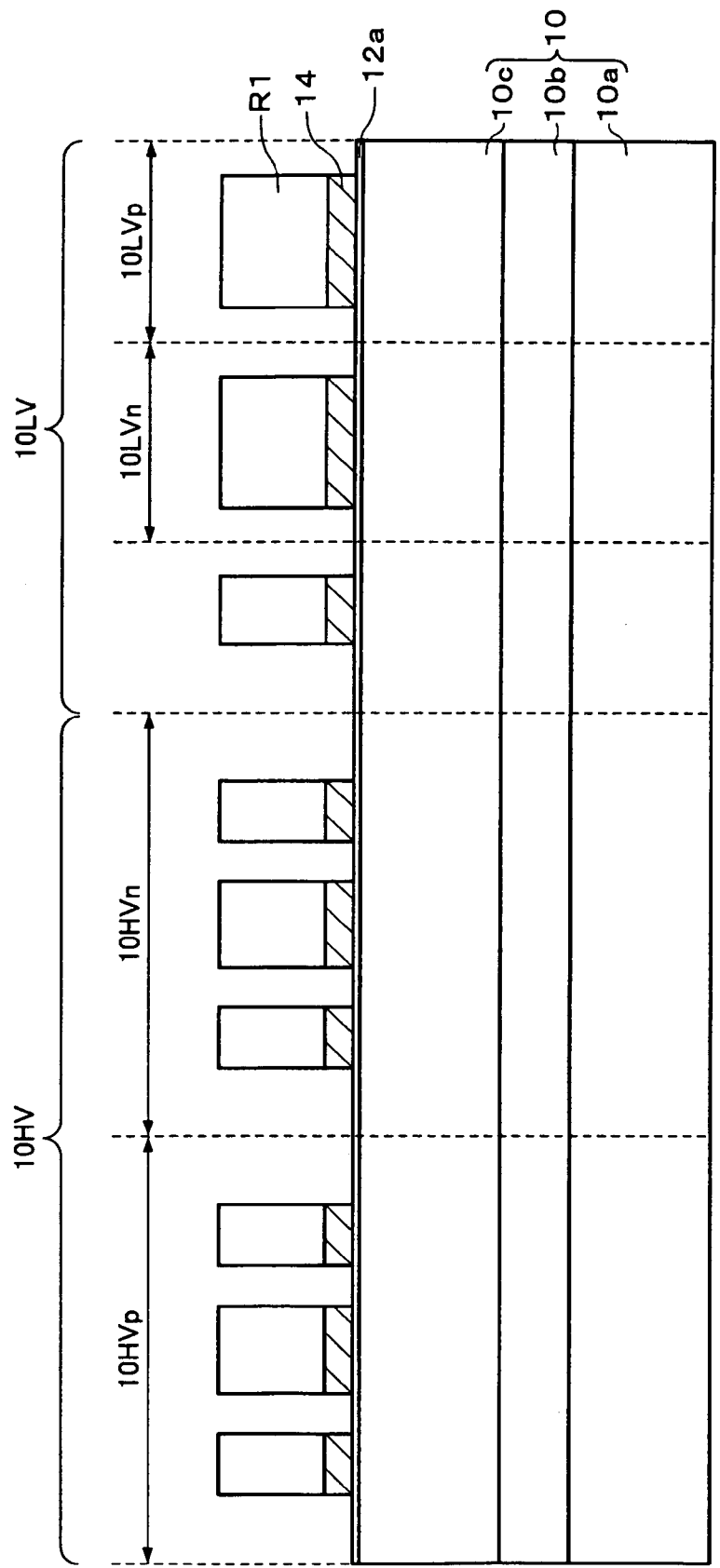
FIG. 4 is a cross-sectional view showing one process of the method of manufacturing the semiconductor device shown in FIG. 1.

(2) Then, as shown in FIG. 4, the stopper insulating layer 14a is etched using the resist layer R1 (See FIG. 3.) as a mask. Thus, the stopper layer 14 is formed. The stopper insulating layer 14a can be etched by a known etching technology.

Figure 5:
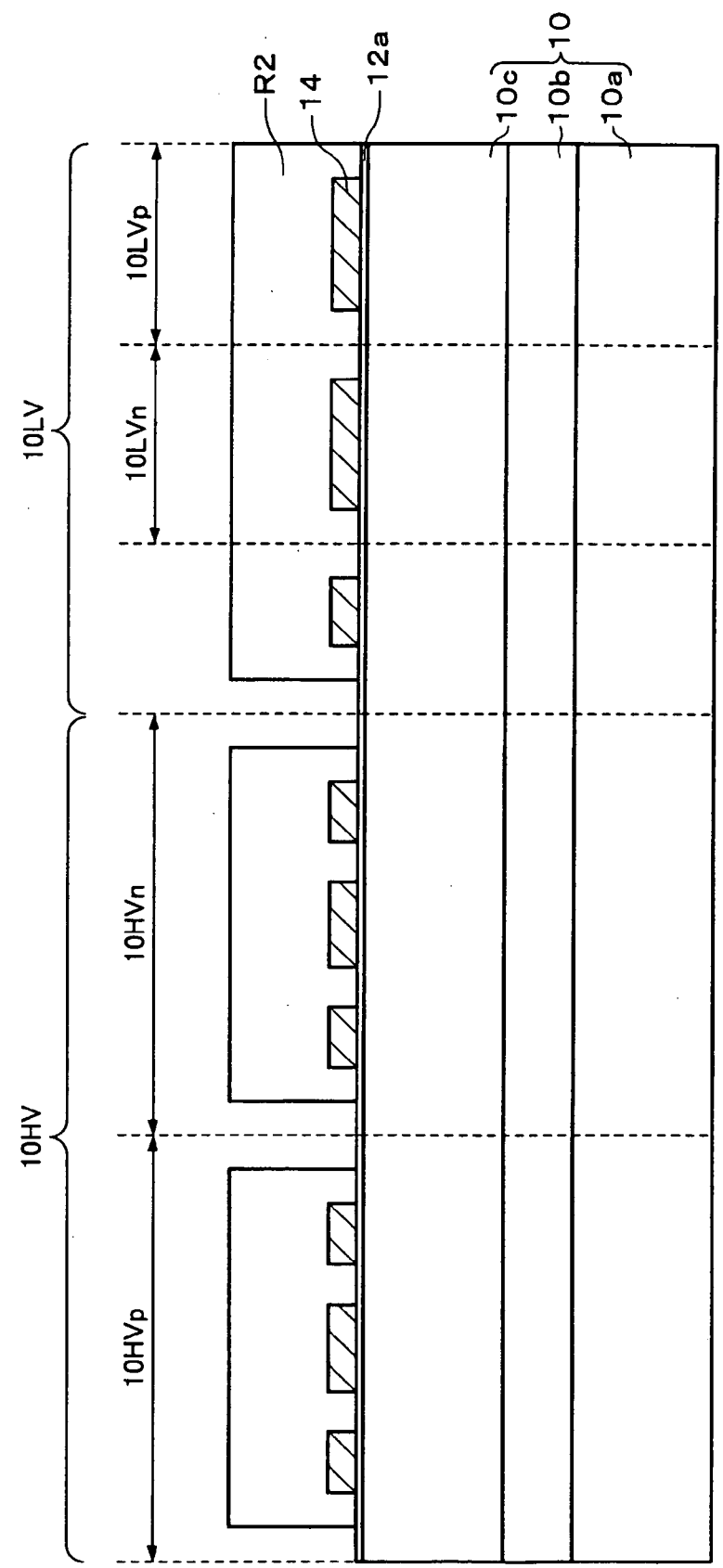
FIG. 5 is a cross-sectional view showing one process of the method of manufacturing the semiconductor device shown in FIG. 1.

(3) Then, as shown in FIG. 5, a resist layer R2 having a predetermined pattern is formed. The resist layer R2 has a pattern including smaller openings compared to the width of the trenches to be finally formed for the first and the third element isolation regions. In this case, by keeping the first insulating layer 12a without being etched in the process of (2), the semiconductor layer 10c can be prevented from being directly contacted to the resist layer R2.

Figure 6:
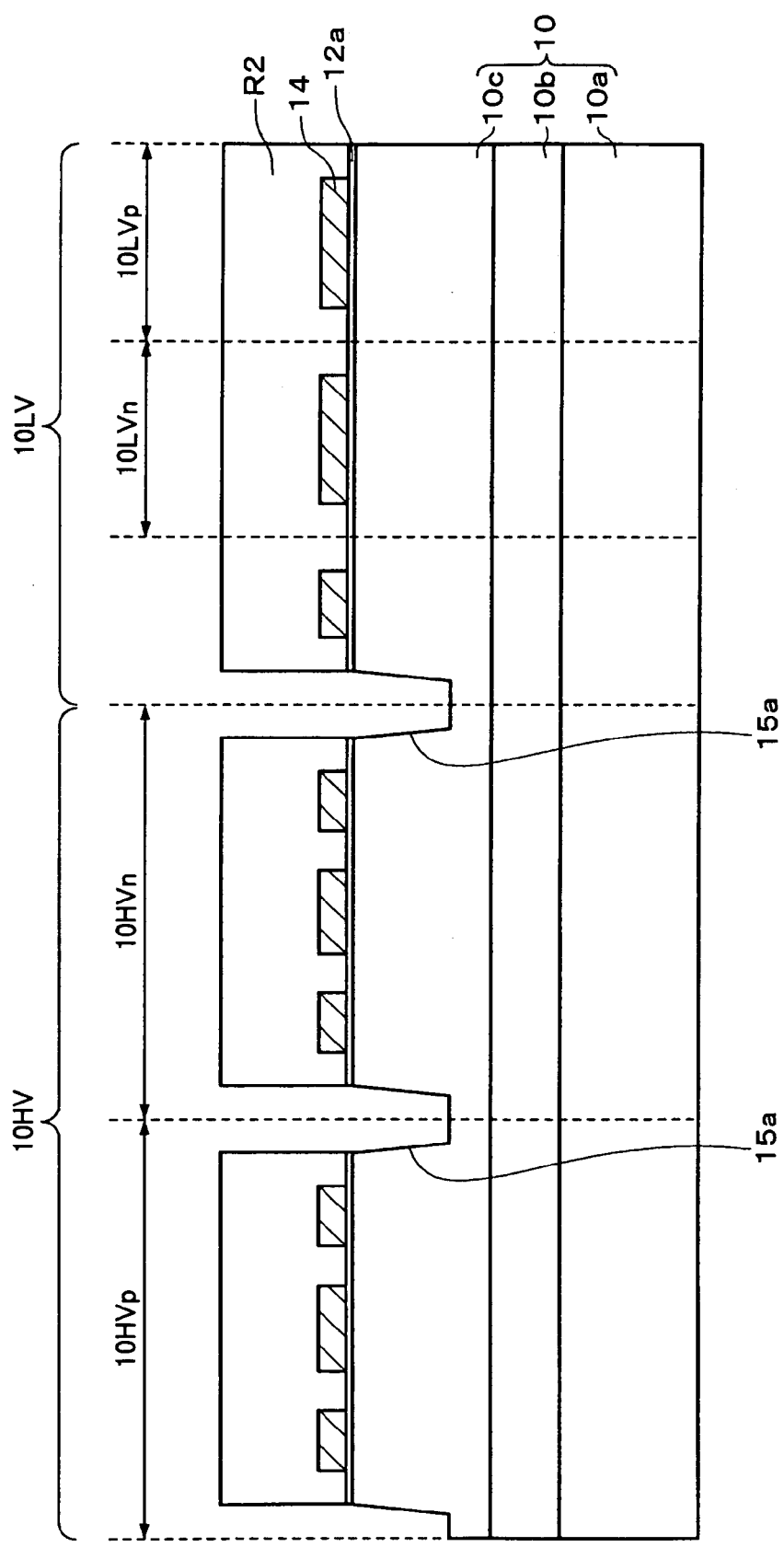
FIG. 6 is a cross-sectional view showing one process of the method of manufacturing the semiconductor device shown in FIG. 1.

(4) Thereafter, as shown in FIG. 6, the first insulating layer 12a and the semiconductor substrate 10 are etched using the resist layer R2 as a mask by a known technology. Thus, the groove sections 15a are formed. The depth of the groove sections 15a is determined by subtracting the depth of the trench for the second element isolation region 210 formed in a process described below from the thickness of the semiconductor layer 10c. After completion of forming the groove sections 15a, the resist layer R2 is removed by, for example, ashing.

Figure 7:
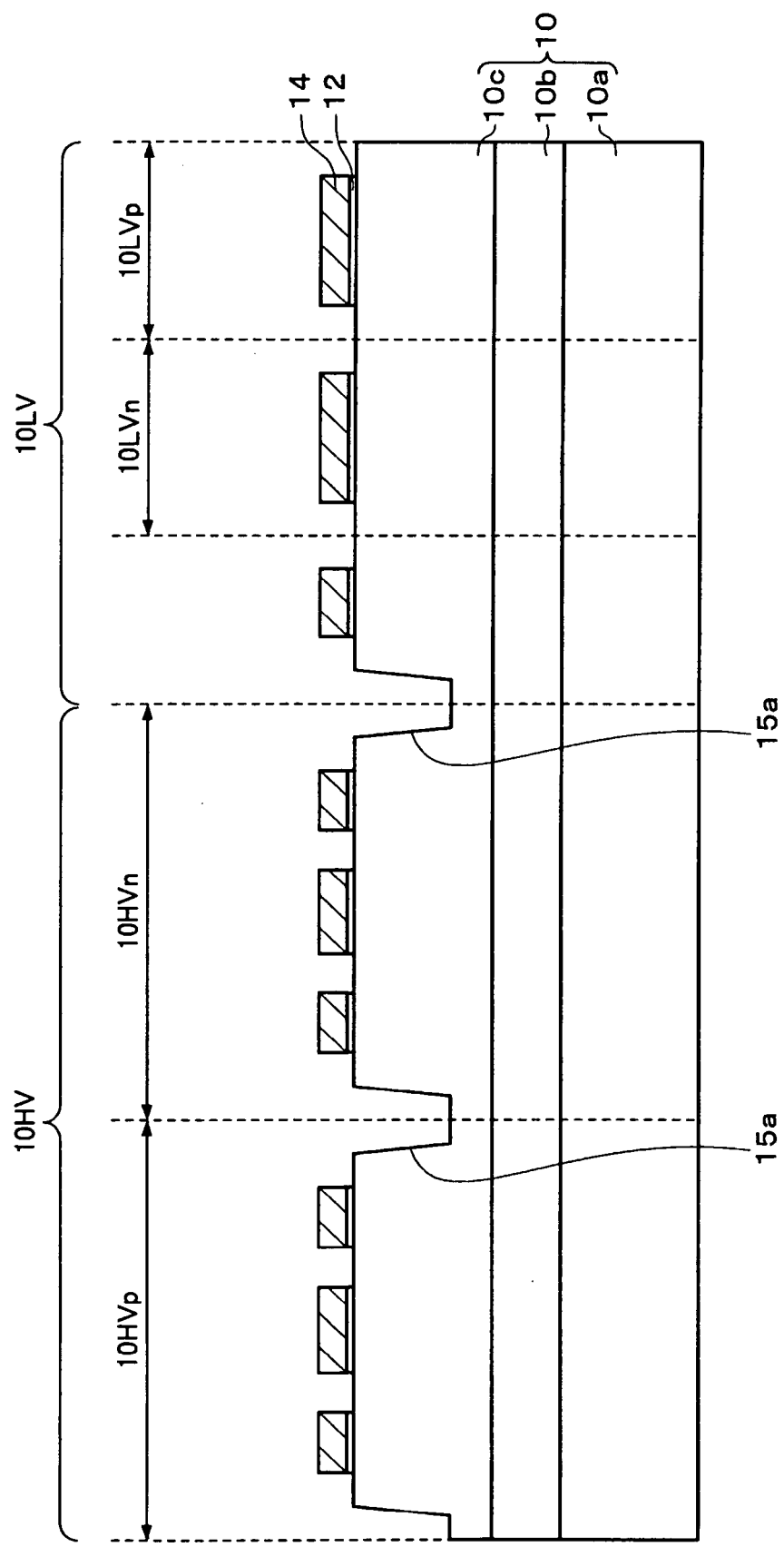
FIG. 7 is a cross-sectional view showing one process of the method of manufacturing the semiconductor device shown in FIG. 1.

(5) Then, as shown in FIG. 7, by removing the exposed portion of the first insulating layer 12a with a known etching technology, a pad layer 12 can be formed.

Figure 8:
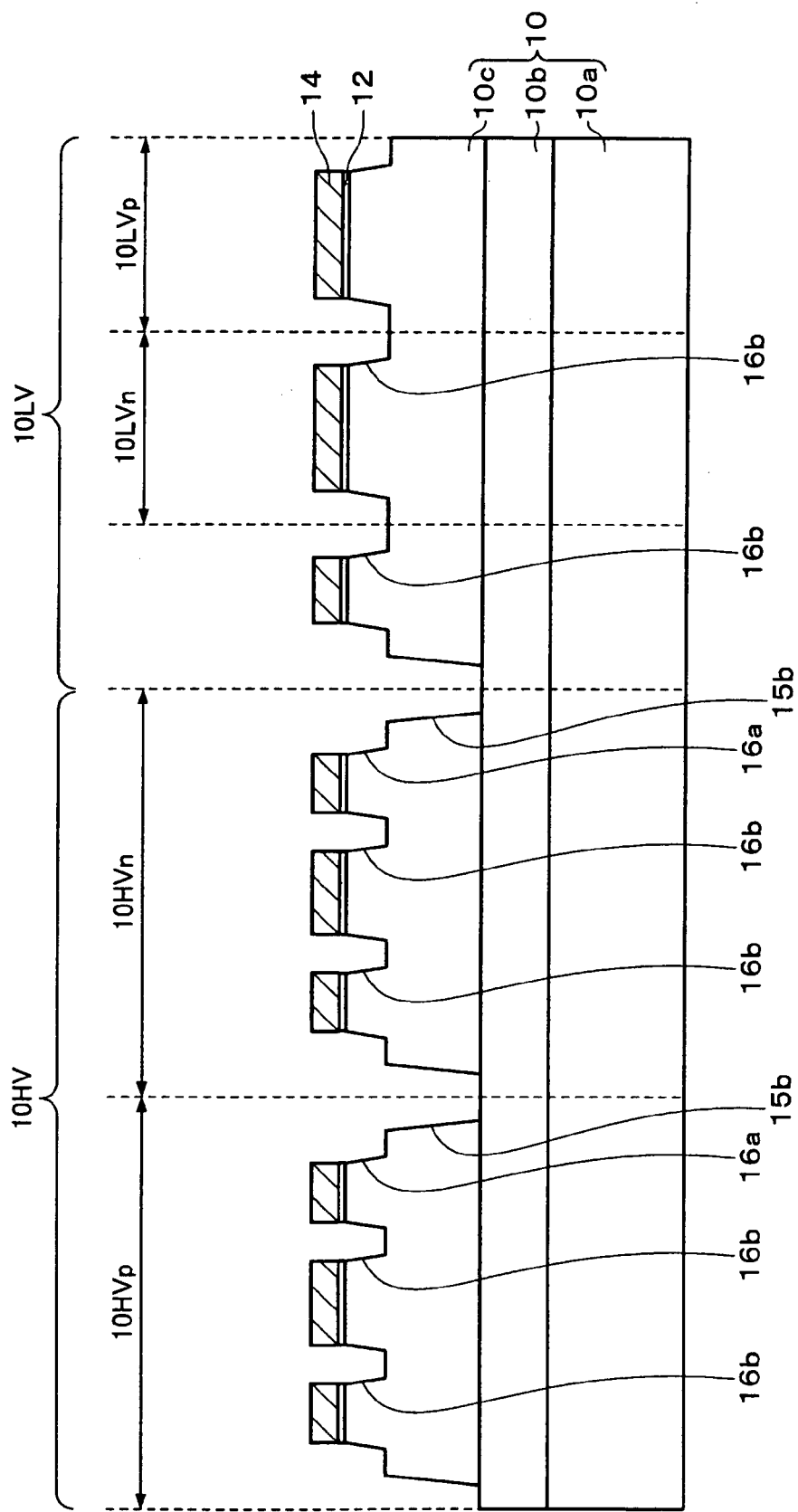
FIG. 8 is a cross-sectional view showing one process of the method of manufacturing the semiconductor device shown in FIG. 1.

(6) Then, as shown in FIG. 8, the semiconductor layer 10 is etched by a typical etching technology using the stopper layer 14 and the pad layer 12 as masks. Thus, the groove sections 15a formed in the process of (4) are further etched to become the first trenches 15b that are deep enough to reach the insulating layer 10b. Further, the second trench 16a having a larger opening than the first trench 15b is formed above the first trench 15b. Namely, in the first and the third element isolation regions 110a and 110b, a dual trench having the second trench 16a having a larger opening in upper position and the first trench 15b that is deep enough to reach the insulating layer 10b.

Concurrently, the trenches 16b are formed in the second element isolation region 210 and the offset regions of the high breakdown-voltage transistors.

Figure 9:
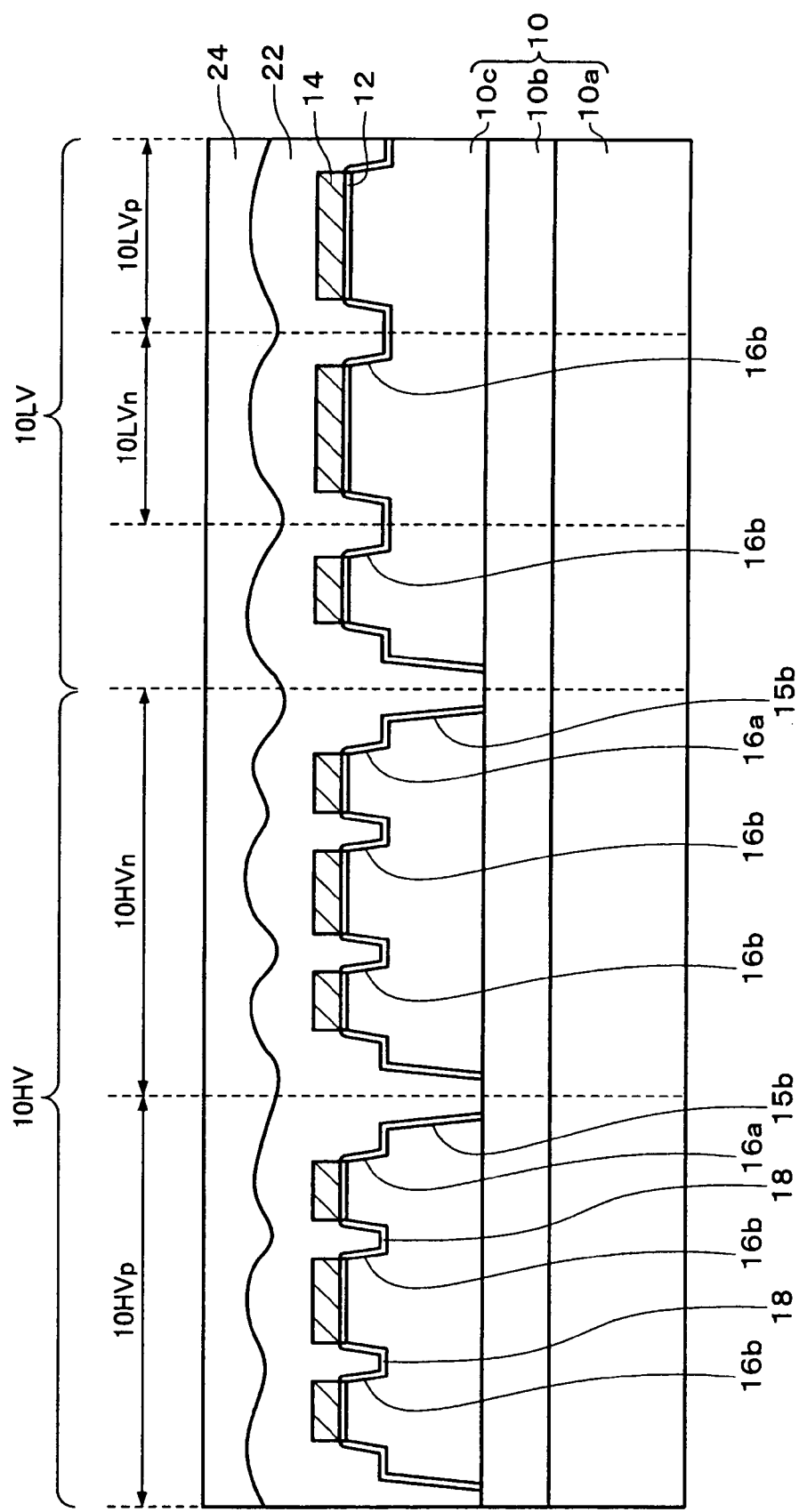
FIG. 9 is a cross-sectional view showing one process of the method of manufacturing the semiconductor device shown in FIG. 1.

(7) Thereafter, as shown in FIG. 9, a trench oxide film 18 is formed on the surfaces of the first trench 15b, the second trench 16a, and the trench 16b. The trench oxide film 18 is formed, for example, by a thermal oxidation process. The thickness of the trench oxide film 18 is, for example, between 50 and 500 nm.

In this case, prior to forming the trench oxide film 18, an edge section of the pad insulating layer 12 can be etched if necessary. By performing this process, the trench oxide film 18 can be formed so as to have rounded shapes at the upper edges of the second trench 16a and the trench 16b. Since the trench oxide film 18 has rounded shapes at the upper edges of the second trench 16a and the trench 16b to eliminate any steps, the trench insulating layer can be embedded in good conditions in the subsequent process.

Subsequently, an insulating layer 22 is formed so as to fill the first trench 15b, the second trench 16a, and the trench 16b. The insulating layer 22 is thick enough to fill the first trench 15b, the second trench 16a, and the trench 16b and further to cover the stopper layer 14. As shown in FIG. 9, an SOG film is subsequently deposited on the insulating layer 22 to form a flat surface, if necessary.

Figure 10:
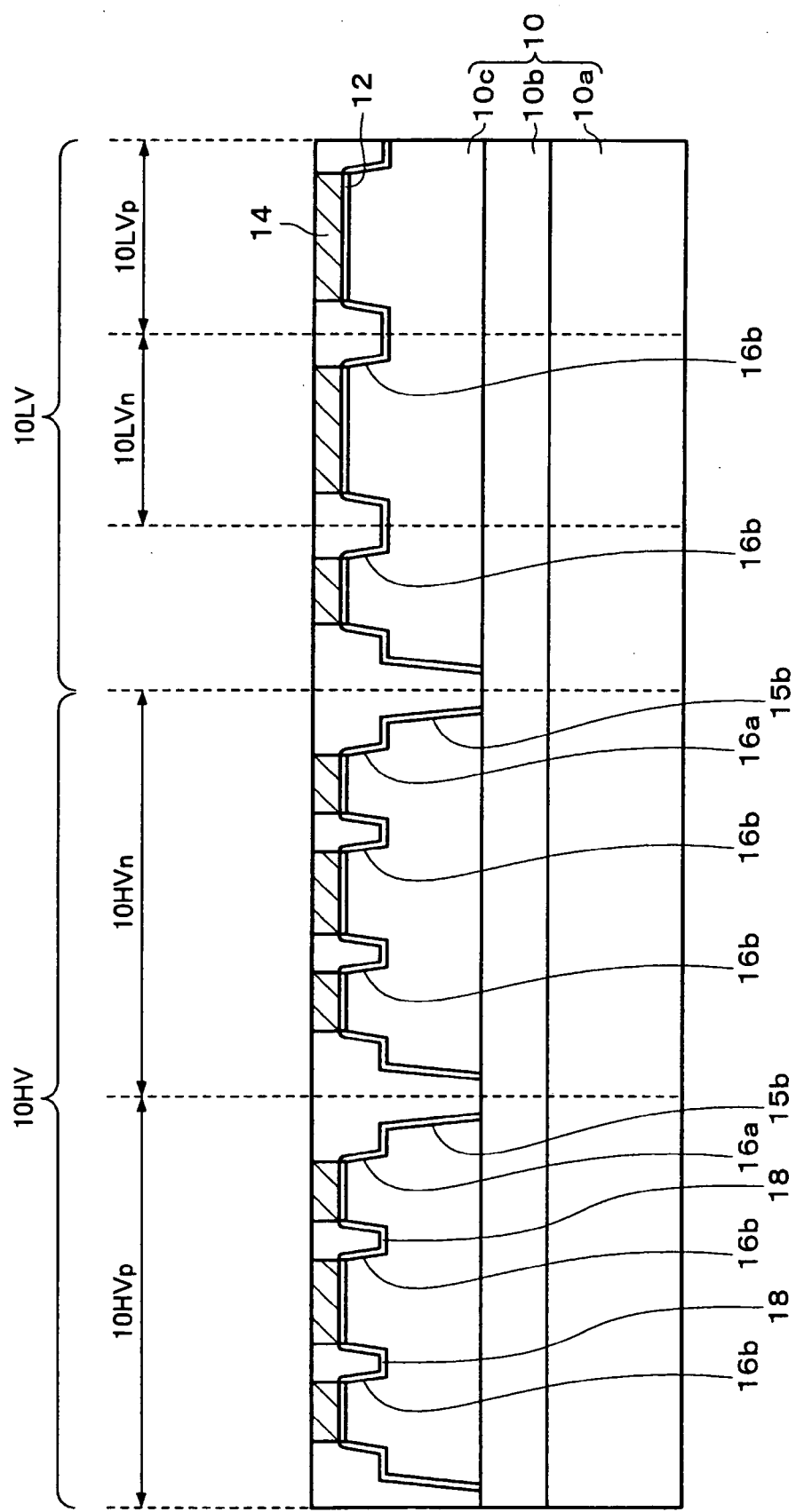
FIG. 10 is a cross-sectional view showing one process of the method of manufacturing the semiconductor device shown in FIG. 1.

(8) Then, as shown in FIG. 10, the SOG film 24 and the insulating layer 22 are removed to expose the upper surface of the stopper layer 14. The SOG film 24 and the insulating layer are removed by, for example, the CMP process or the like. Thus, a trench insulating layer 20a is formed in the dual trench formed of the first trench 15b and the second trench 16a, and a trench insulating layer 20b is formed in the trench 16b. As a result, the first and the third element isolation regions 110a, 110b and the second element isolation region 210 are formed. Furthermore, in the present process, the offset insulating layer that forms a part of the second gate insulating layer 112 is formed in the offset region of the high breakdown-voltage transistor region 10HV. Note that in the present embodiment the offset insulating layer and the second element isolation region 210 are referred to as the trench insulating layer 20b because these are formed by the trench element isolation method.

Figure 11:
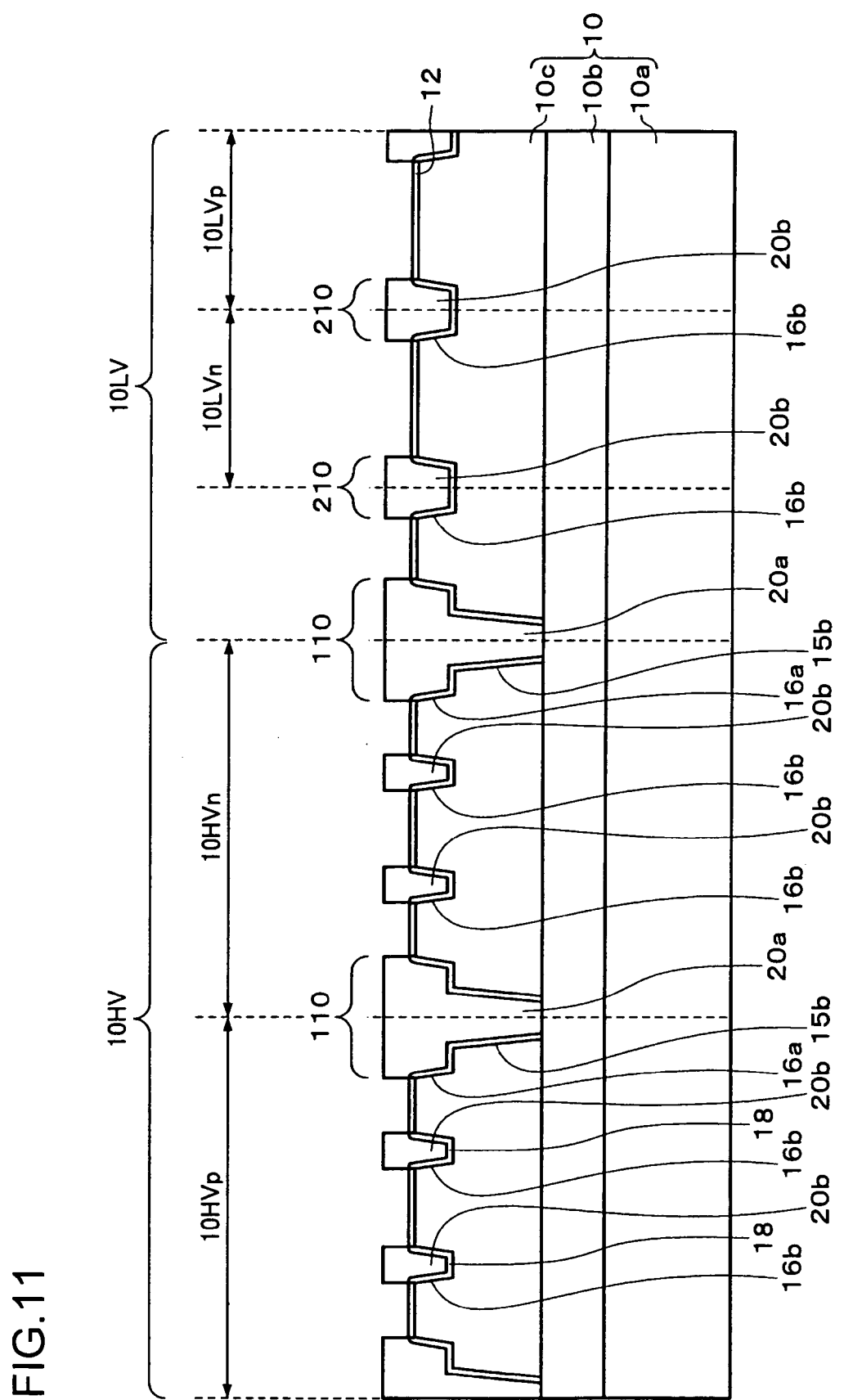
FIG. 11 is a cross-sectional view showing one process of the method of manufacturing the semiconductor device shown in FIG. 1.

(9) Then, as shown in FIG. 11, the stopper layer 14 is removed. The stopper layer 14 is removed by, for example, wet etching using hot phosphoric acid. Subsequently, a sacrificial oxide film (not shown in the drawings) is formed on the upper surface of the semiconductor layer 10. As the sacrificial oxide film, for example, a silicon oxide film can be formed. In this case, the film can be formed by the thermal oxidation process.

Figure 12:
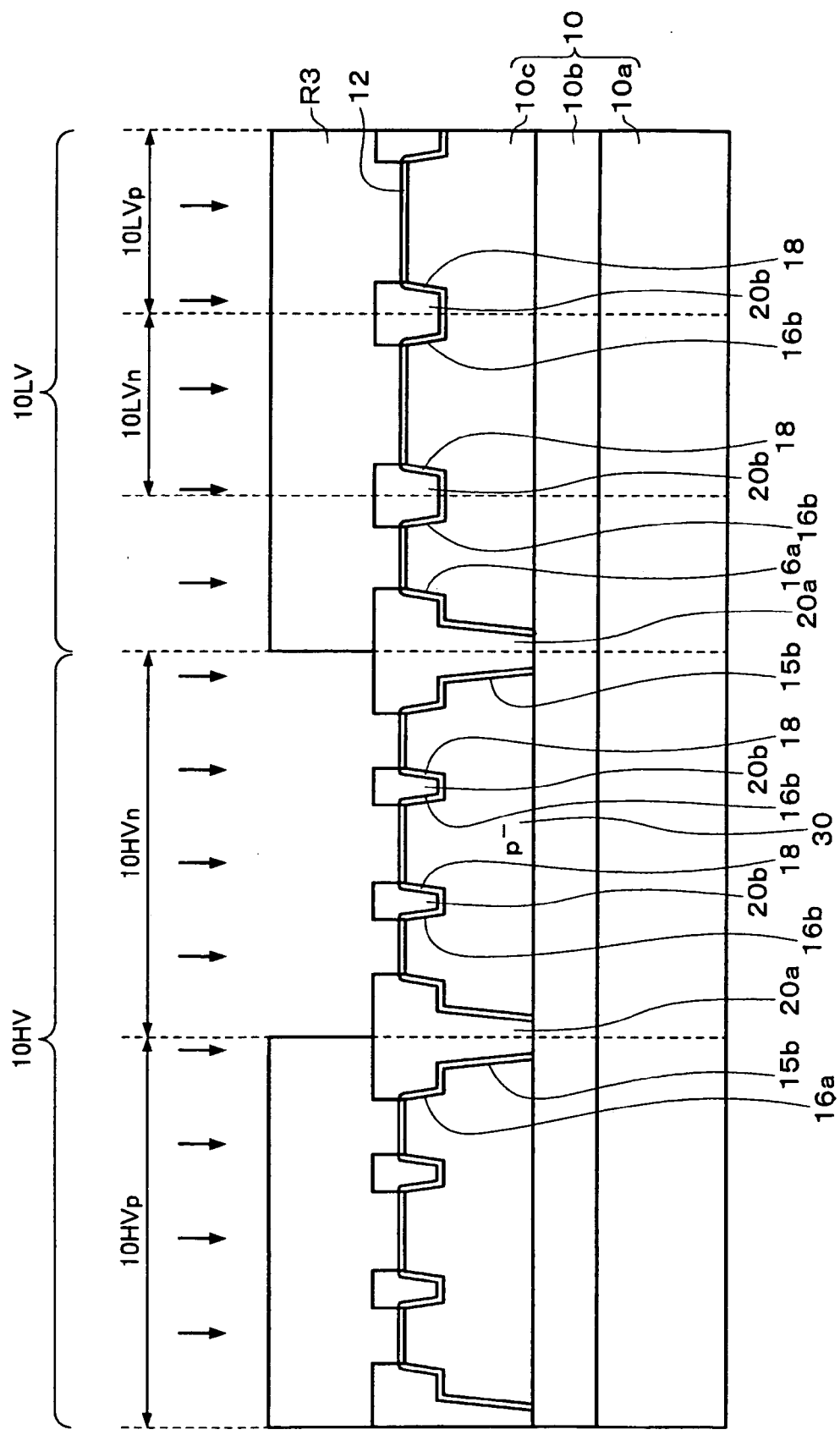
FIG. 12 is a cross-sectional view showing one process of the method of manufacturing the semiconductor device shown in FIG. 1.

(10) Then, as shown in FIG. 12, the P type well 30 is formed in the high breakdown-voltage transistor region 10HV. Specifically, a resist layer R3 having a predetermined pattern is provided, and then the P type well 30 is formed by implanting the P type impurity ion to the semiconductor layer 10c using the resist R3 as the mask. Thereafter, the resist layer R3 is removed by ashing.

Figure 13:
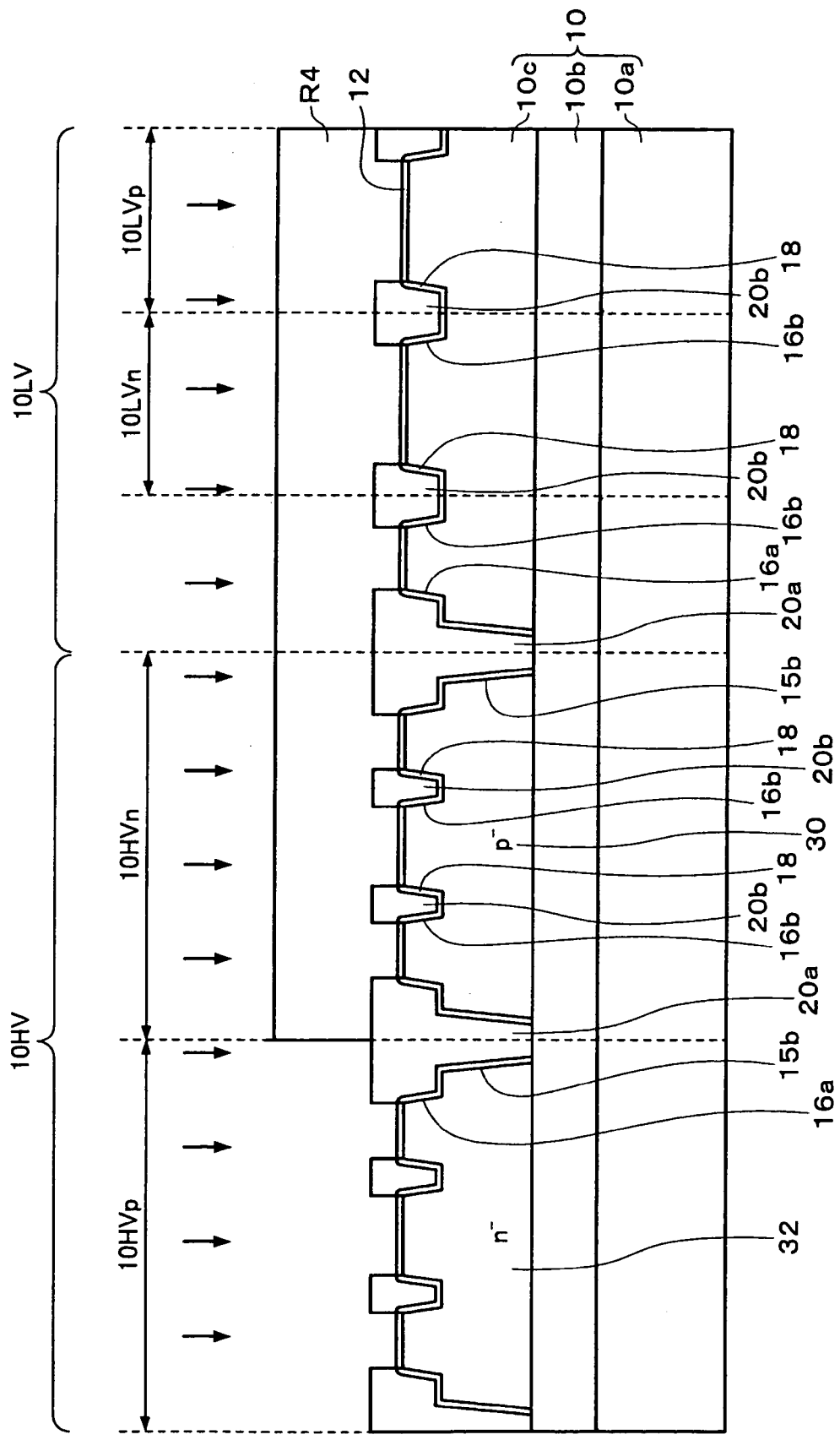
FIG. 13 is a cross-sectional view showing one process of the method of manufacturing the semiconductor device shown in FIG. 1.

(11) Then, as shown in FIG. 13, the N type well 32 is formed in the high breakdown-voltage transistor region 10HV. Firstly, a resist layer R4 having a predetermined pattern is formed. Then, the N type well 32 is formed inside the semiconductor substrate 10 by injecting an N type impurity such as phosphorous or arsenic to the semiconductor layer 10c once or several times using the resist layer R4 as the mask. Thereafter, the resist layer R4 is removed by ashing. Note that the order of the processes (10) and (11) can be reversed.

Figure 14:
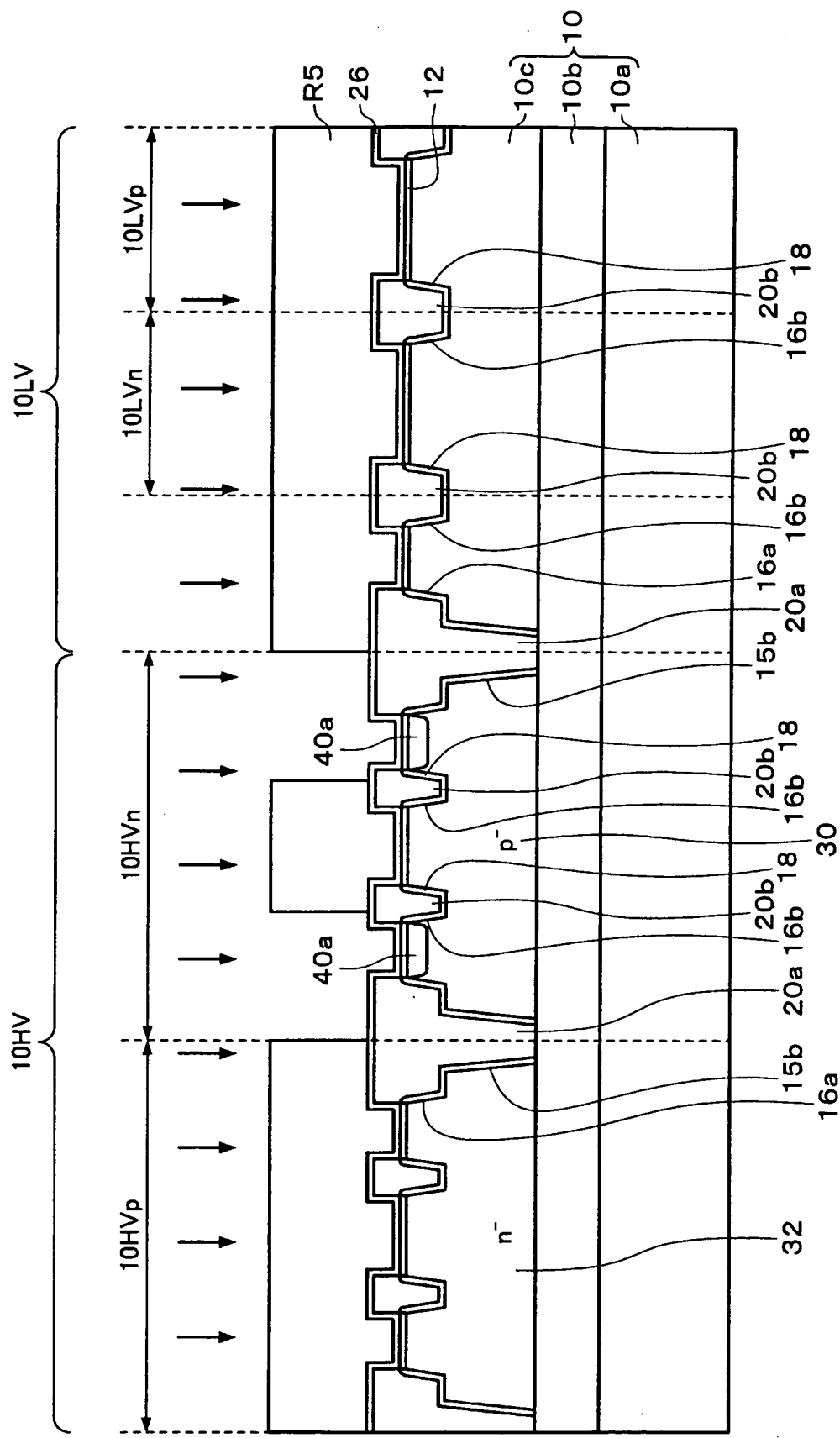
FIG. 14 is a cross-sectional view showing one process of the method of manufacturing the semiconductor device shown in FIG. 1.

(12) Then, as shown in FIG. 14, a silicon nitride film 26 is formed over the entire area of the high breakdown-voltage transistor region 10HV and the low breakdown-voltage transistor region 10LV.

(13) Then, as shown in FIG. 14, the impurity layer for the offset region of the N type source/drain region is formed in the high breakdown-voltage transistor region 10HV. Firstly, a resist layer R5 for covering a predetermined region is provided. By injecting the N type impurity to the semiconductor layer 10c using the resist layer R5 as the mask, the impurity layer 40a is formed. Thus, the impurity layer 40a for the offset region of the source/drain region is formed in the N channel high breakdown-voltage transistor region 10HVn. Thereafter, the resist layer R5 is removed by ashing.

Figure 15:
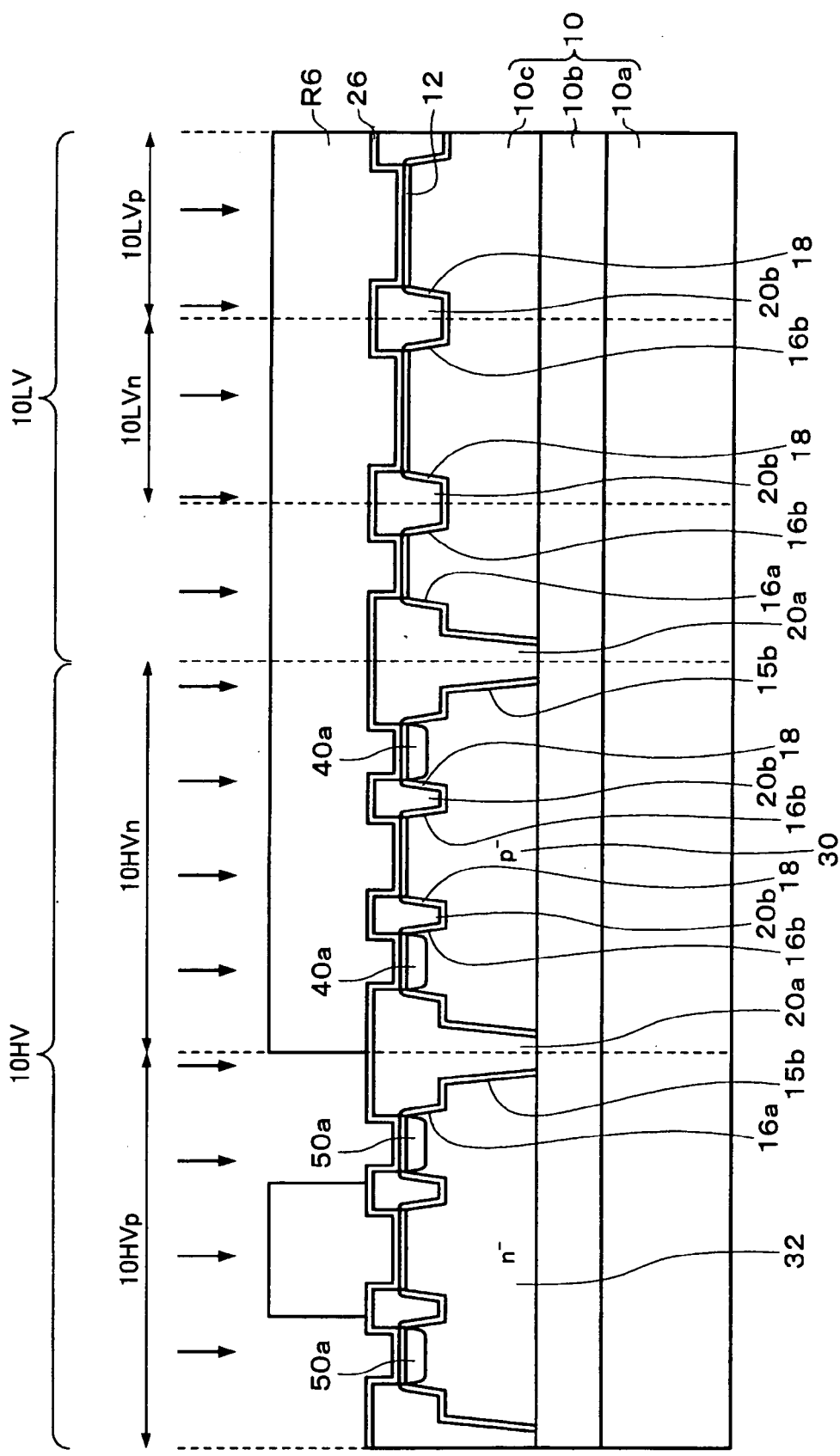
FIG. 15 is a cross-sectional view showing one process of the method of manufacturing the semiconductor device shown in FIG. 1.

(14) Then, as shown in FIG. 15, in the high breakdown-voltage transistor region 10HV, the impurity layer for the offset region of the P type source/drain region is formed. Firstly, a resist layer R6 for covering a predetermined region is provided. A P type impurity is injected to the semiconductor layer 10c using the resist layer R6 as the mask. Thus, the impurity layer 50a for the offset region of the source/drain region is formed in the P channel high breakdown-voltage transistor region 10HVp. Thereafter, the resist layer R6 is removed by ashing.

Figure 16:
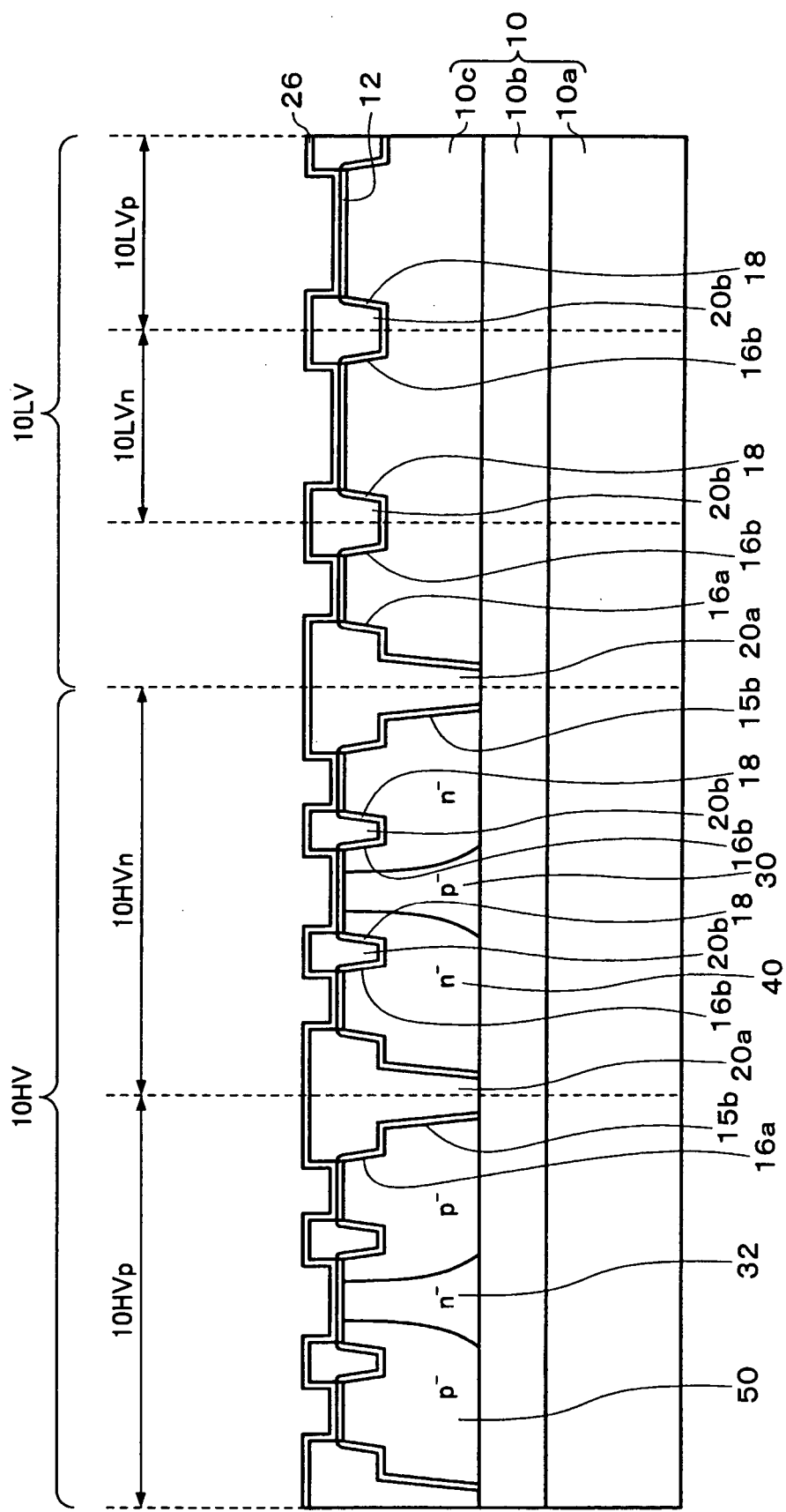
FIG. 16 is a cross-sectional view showing one process of the method of manufacturing the semiconductor device shown in FIG. 1.

(15) Then, as shown in FIG. 16, by applying a thermal treatment the impurities in the impurity layers 40a, 50a are diffused to form low concentration impurity layers 40, 50 that are to form the offset regions of the high breakdown-voltage transistors 100P, 100N. Note that the process (15) can be executed subsequently to the injection of the impurity in each of the processes (13) and (14). Furthermore, the processes (13) and (14) can be executed in reverse order.

Figure 17:
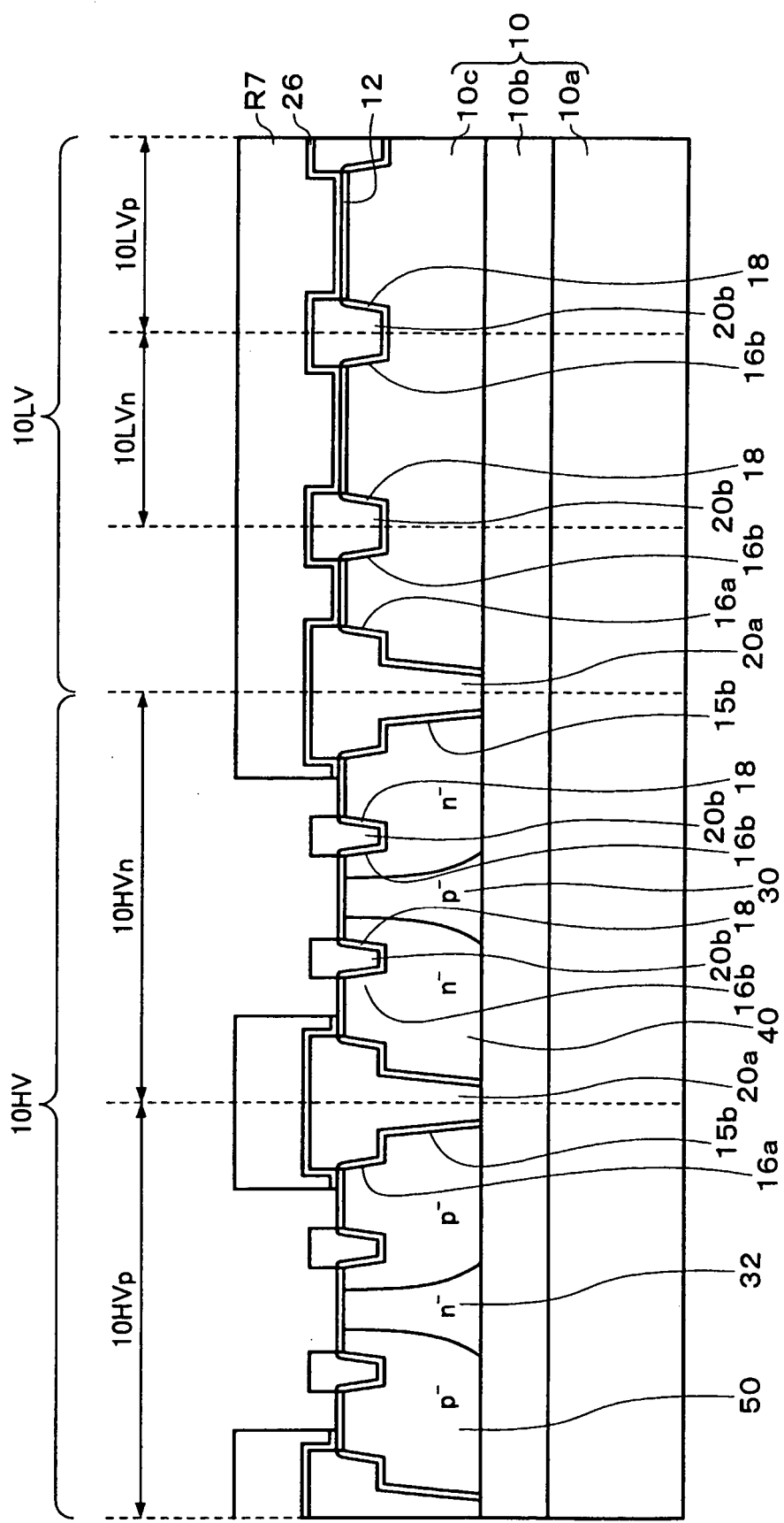
FIG. 17 is a cross-sectional view showing one process of the method of manufacturing the semiconductor device shown in FIG. 1.

(16) Thereafter, as shown in FIG. 17, in the high breakdown-voltage transistor region 10H, a resist layer R7 is formed so as to cover regions other than the regions forming gate insulating layers of the respective high breakdown-voltage transistor. Using the resist layer R7 as the mask, the exposed portions of the silicon nitride film 26 are removed. Then, in the high breakdown-voltage transistor region 10HV, the N channel doping and the P channel doping are executed if necessary. The N channel doping and the P channel doping are carried out by providing a resist layer (not shown in the drawings) having a predetermined pattern using a typical lithography technology and then injecting a predetermined conductive type of impurity.

Figure 18:
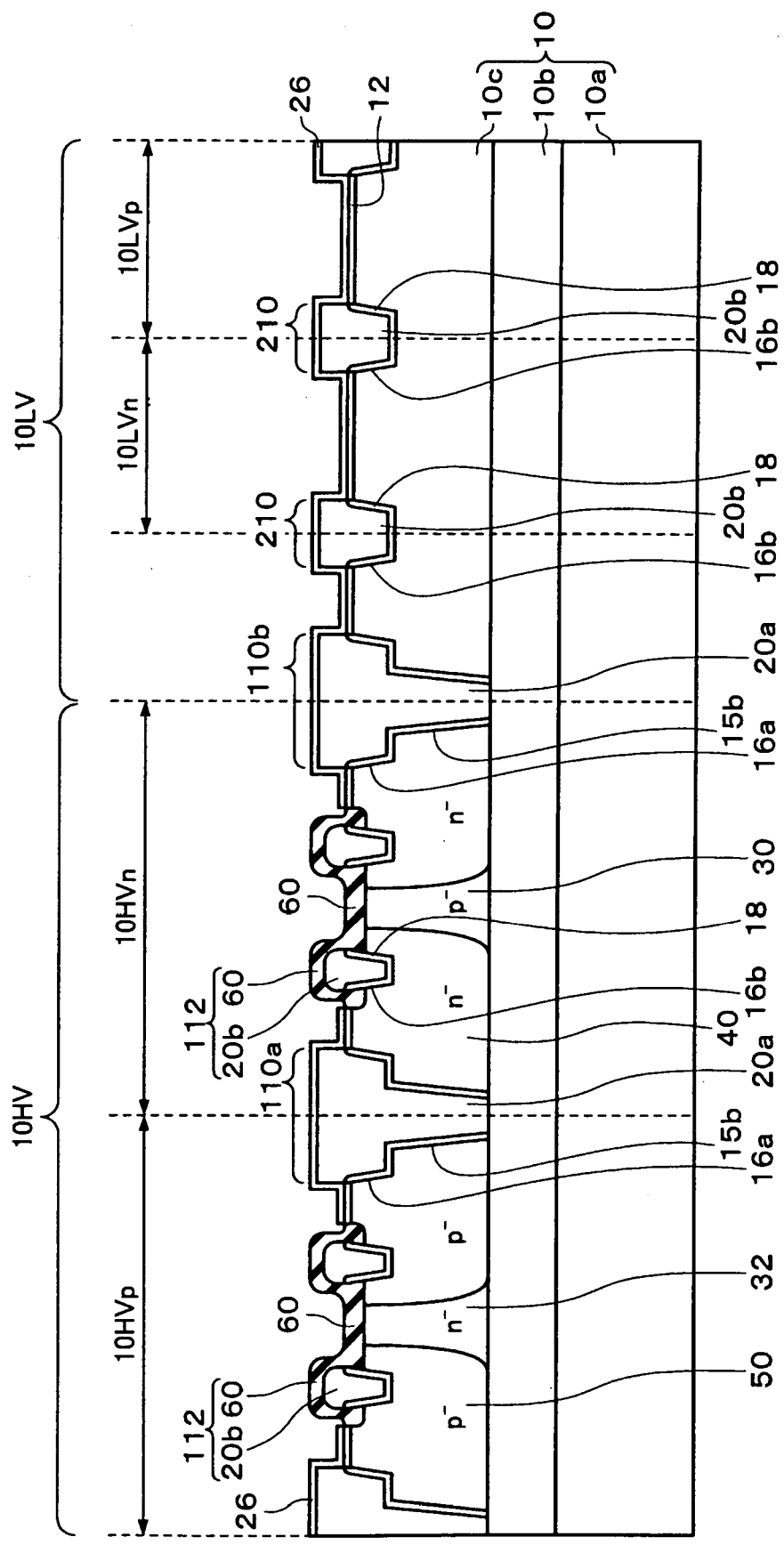
FIG. 18 is a cross-sectional view showing one process of the method of manufacturing the semiconductor device shown in FIG. 1.

(17) Then, as shown in FIG. 18, after removing the exposed pad layer 12, the first gate insulating layer 60 is formed in the high breakdown-voltage transistor region 10HV. The pad layer 12 can be etched by, for example, wet etching using hydrofluoric acid. The first gate insulating layer 60 can be formed by the selective thermal oxidation process. The thickness of the first gate insulating layer 60 is about 1600 Å. The remaining silicon nitride film 26 is subsequently removed.

Figure 19:
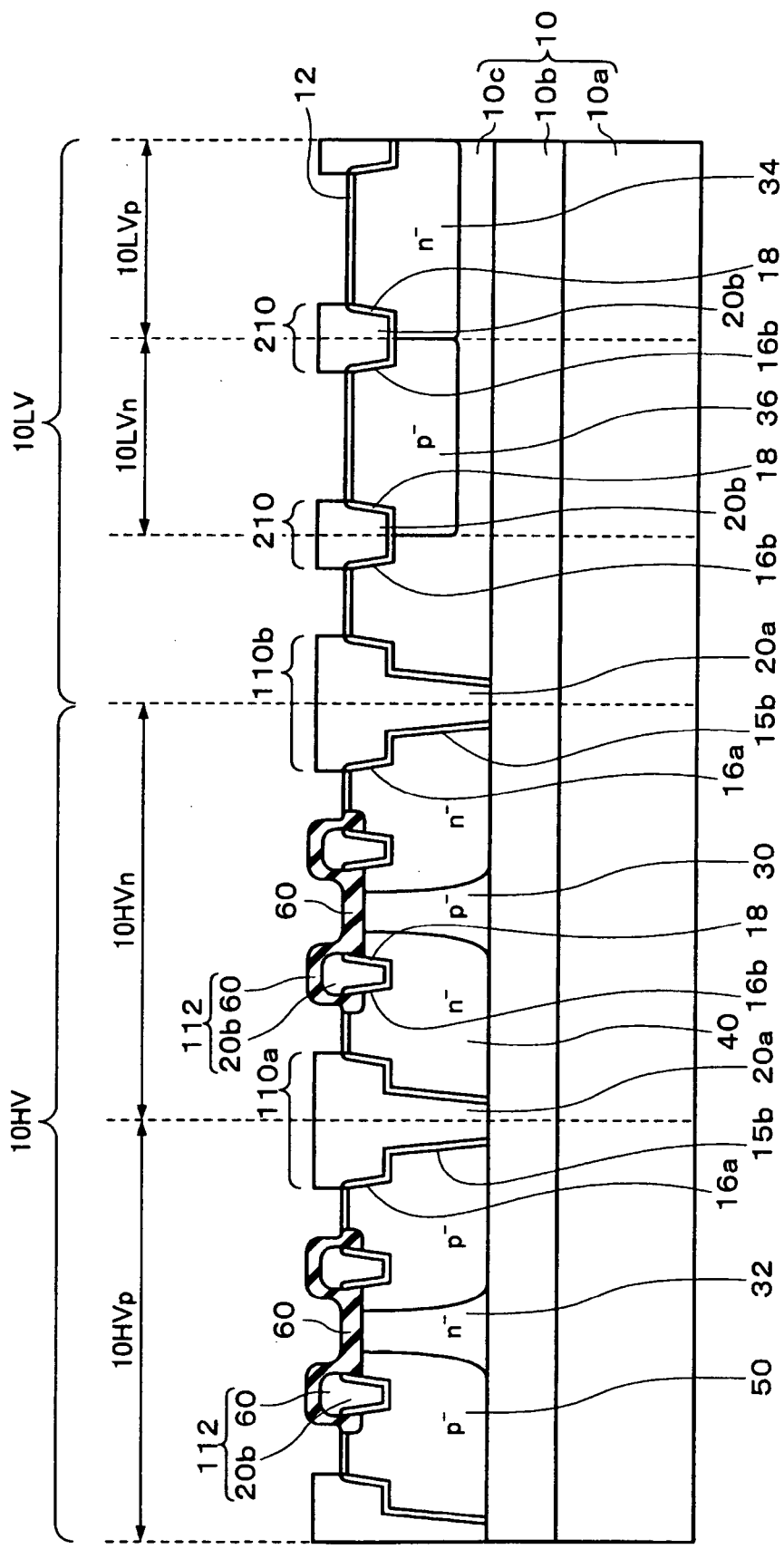
FIG. 19 is a cross-sectional view showing one process of the method of manufacturing the semiconductor device shown in FIG. 1.

(18) Then, as shown in FIG. 19, in the low breakdown-voltage transistor region 10LV, the N type well 34 and the P type well 36 are formed. The N type well 34 and the P type well 36 are formed by providing a mask layer having a predetermined pattern using a typical lithography technology and then injecting a predetermined conductive type of impurity. If necessary, channel doping can be executed.

Figure 20:
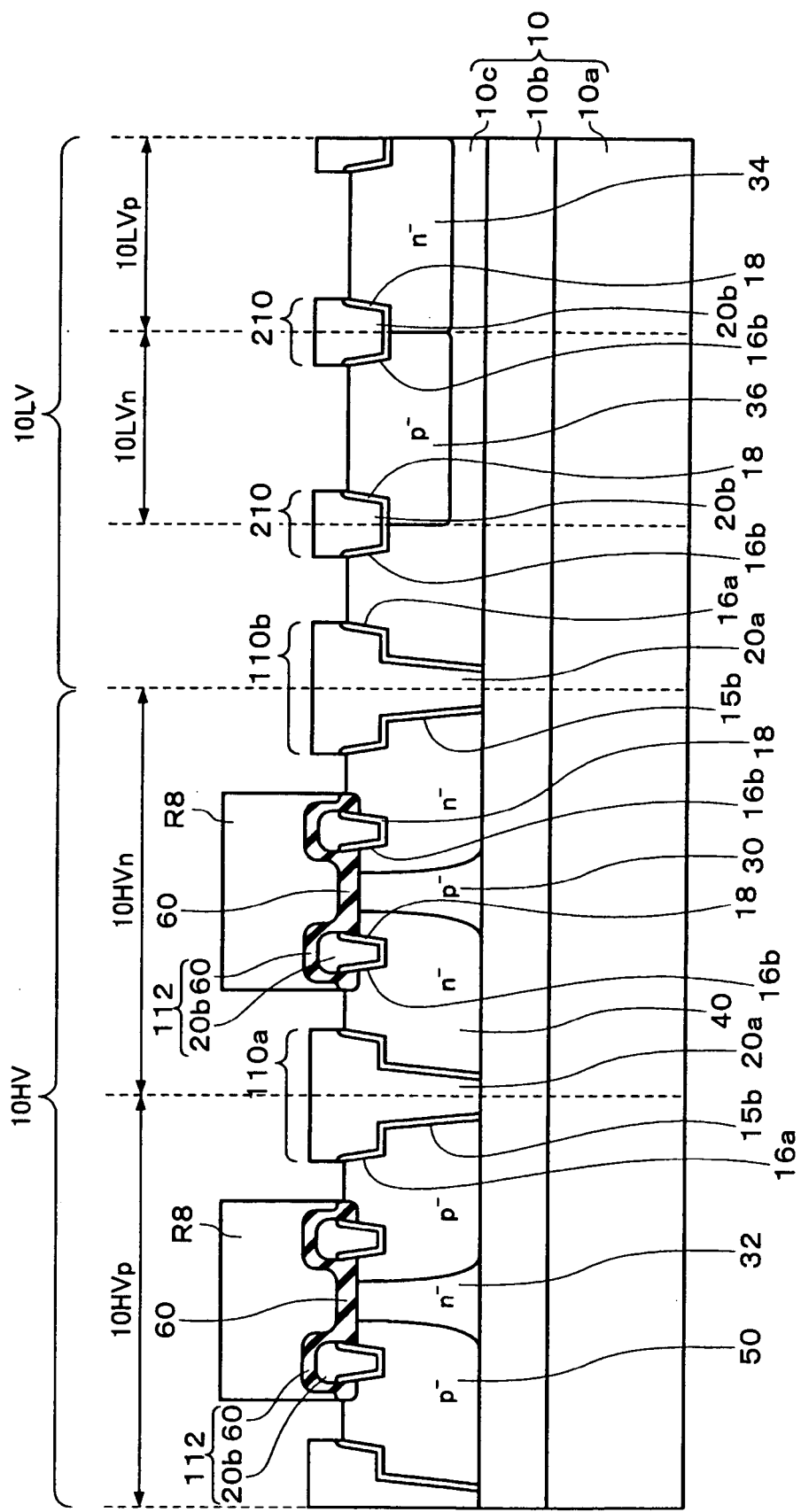
FIG. 20 is a cross-sectional view showing one process of the method of manufacturing the semiconductor device shown in FIG. 1.

(19) Then, as shown in FIG. 20, in the high breakdown-voltage transistor region 10HV, a resist layer R8 is formed so as to cover the region where the first gate insulating layer 60 is formed, and then the exposed pad layer 12 is removed.

Figure 21:
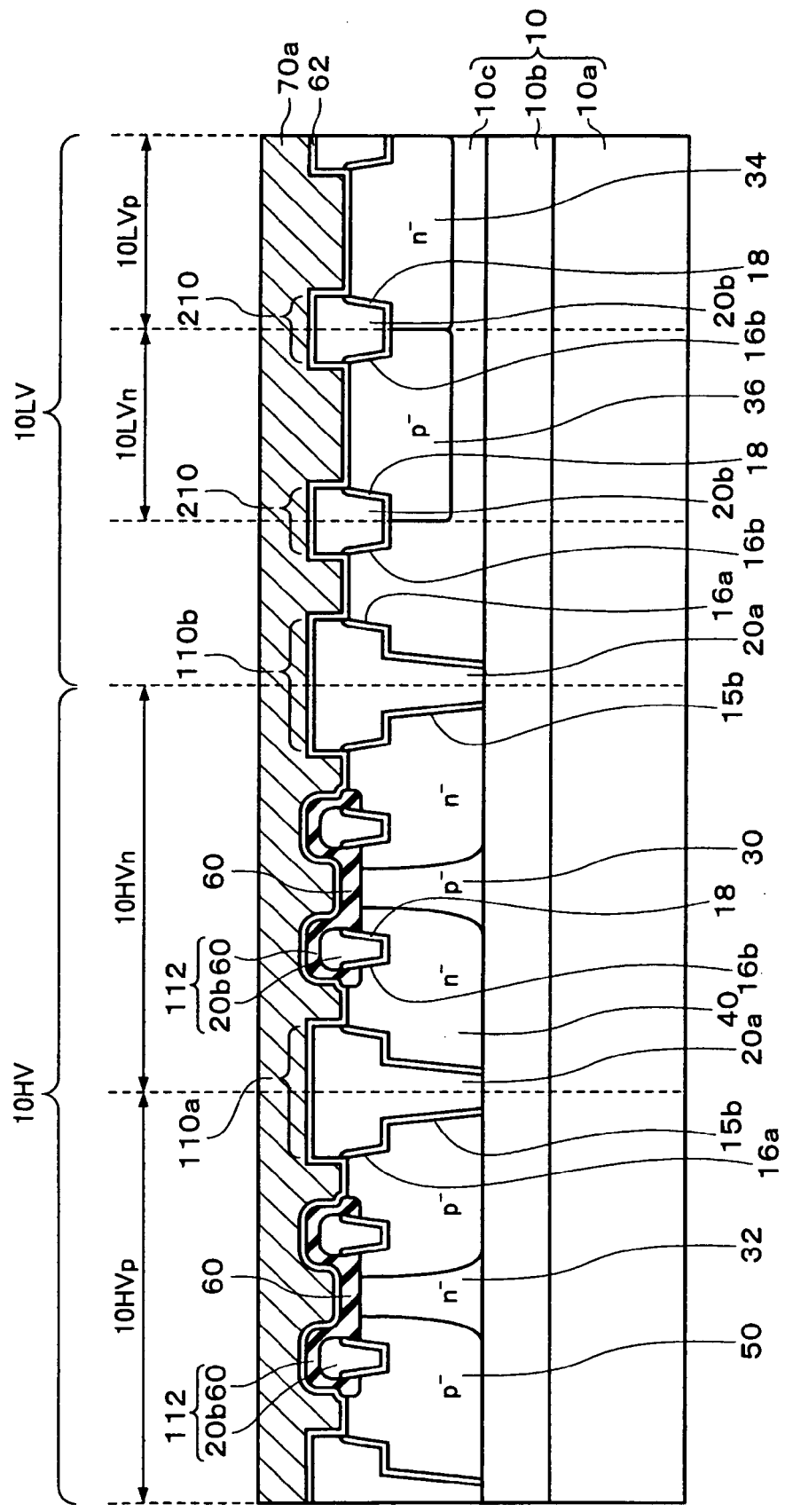
FIG. 21 is a cross-sectional view showing one process of the method of manufacturing the semiconductor device shown in FIG. 1.

(20) Then, as shown in FIG. 21, the gate insulating layer 62 for the low breakdown-voltage transistor is formed. The gate insulating layer 62 is formed by, for example, the thermal oxidation process. The thickness of the gate insulating layer 62 is, for example, 45 Å. The gate insulating layer 62 is also formed in the high breakdown-voltage transistor region 10HV.

Subsequently, as shown in FIG. 21, a conductive layer 70a is formed over the whole area of the high breakdown-voltage transistor region 10HV and the low breakdown-voltage transistor region 10LV. As the conductive layer 70a, for example, a polysilicon layer is formed. If the polysilicon layer is formed as a material of the conductive layer 70a, the resistance of the gate electrode can be reduced by injecting an n type impurity to the portions of the conductive layer 70a that are to form the gate electrodes of the N channel high breakdown-voltage transistors 100N and the N channel low breakdown-voltage transistors 200N.

Figure 22:
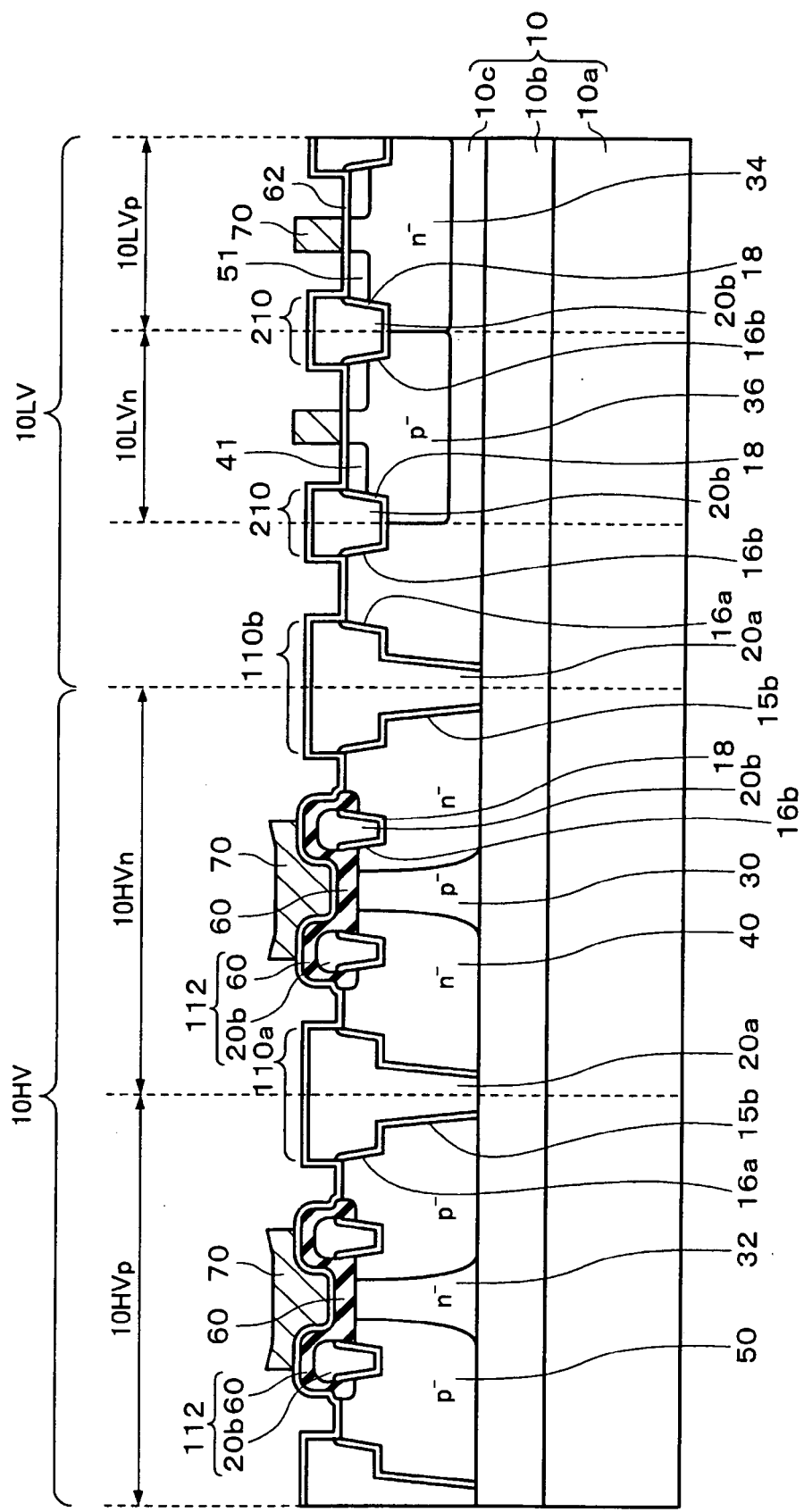
FIG. 22 is a cross-sectional view showing one process of the method of manufacturing the semiconductor device shown in FIG. 1.

(21) Then, a resist layer (not shown in the drawings) having a predetermined pattern is formed. By patterning the polysilicon layer using the resist layer as the mask, the gate electrode 70 is formed as shown in FIG. 22.

Subsequently, low concentration impurity layers 41, 51 for the respective transistors 200P, 200N are formed in the low breakdown-voltage transistor region 10LV. The low concentration impurity layers 41, 51 can be formed by forming a mask layer using a typical lithography technology and then injecting a predetermined impurity.

Further subsequently, by forming an insulating layer (not shown in the drawings) over the entire surface and then anisotropically etching the insulating layer, the side wall insulating layer 72 (See FIG. 1.) is formed on the side surface of the gate electrode 70. Subsequently, by doping predetermined regions in the P channel high breakdown-voltage transistor region 10HVp and the P channel low breakdown-voltage transistor region 10LVp with a P type impurity, as shown in FIG. 1, the source/drain region 52 is formed outside the side wall insulating layer 72. The P type high concentration impurity layer 52 that forms the source/drain regions can be formed by a known process.

Subsequently, by doping predetermined regions in the N channel high breakdown-voltage transistor region 10HVn and the N channel low breakdown-voltage transistor region 10LVn with an N type impurity, the source/drain region 42 is formed. The N type high concentration impurity layer 42 that forms the source/drain regions can be formed by a known process.

The semiconductor device shown in FIG. 1 is formed as described above.

According to the manufacturing method of the present embodiment, the high breakdown-voltage transistors 100P, 100N are formed in the region separated by the first and the third element isolation regions 110a, 110b that are deep enough to reach the insulating layer 10b. Thus, the wider element isolation region required for ensuring the breakdown-voltage property can be eliminated. Further, the parasitic MOS transistors that are sometimes formed under the element isolation regions can be prevented. Furthermore, since the guard ring formed of the high concentration impurity layer is not necessary, the area of the high breakdown-voltage layer 10HV can be reduced.

According to the manufacturing method of the present embodiment, a part of the process for forming the dual trenches to form the first and the third element isolation regions 110a, 110b and the process for forming the trenches 16b to form the second element isolation regions 210 are executed in a single process, thus reducing the number of processes.

According to the manufacturing method of the present embodiment, trenches having dual trench structures are adopted in the first and the third element isolation regions 110a, 110b. Accordingly, since the second trench 16a having the large upward opening is provided, the first trench 15b can be more easily filled with the insulating layer 20a. As a result, the effective element isolation can be formed, and accordingly, highly reliable semiconductors can be manufactured.

Furthermore, the following can be cited as a further advantage in adopting the dual trench structure. Typically, in semiconductor devices, element separations having various areas are formed. Although dependent on the density of the element isolation region or the aspect ratio of the trench, when the trenches having different element isolation areas are formed, the etching rate of the trench having the larger element isolation area becomes higher because the larger the element isolation area is the more the etching gas is supplied. Therefore, it is difficult to form trenches having different element isolation areas and the same depth. However, by forming the dual trench described in the manufacturing method of a semiconductor device according to the present embodiment, the width of the trenches that are deep enough to reach the insulating layer can be made constant even if the trenches have different element isolation areas. Thus, trenches having different element isolation areas can be easily formed with a constant depth ensured.

Still further, the low breakdown-voltage transistors 200P, 200N can be formed in the regions separated by the second element region 210 that is not deep enough to reach the insulating layer 10b. Thus, the negative effects specific to the SOI substrate such as a floating body effect can be eliminated. Further, regarding the low breakdown-voltage transistor region 10LV, the conventional design properties can be utilized.

Note that the present invention is not limited to the embodiments described above, and can be modified within the scope and/or spirit of the present invention. For example, the second element isolation region 210 or the offset insulating layer (corresponding to the trench insulating layer 20b in the embodiment described above) can be formed by the LOCOS process or the semi-recessed LOCOS process.

What is claimed is:

1. A semiconductor device, comprising:
   a supporting substrate;
   an insulating layer formed on the supporting substrate;
   a first semiconductor layer formed on the insulating layer;
   a first high breakdown-voltage transistor formed in the first semiconductor layer;
   a second semiconductor layer formed on the insulating layer;
   a second high breakdown-voltage transistor formed in the second semiconductor layer;
   a first element isolation region having a depth that reaches the insulating layer and provided between the first semiconductor layer and the second semiconductor layer;
   a third semiconductor layer formed on the insulating layer;
   a first low breakdown-voltage transistor formed in the third semiconductor layer;
   a second low breakdown-voltage transistor formed in the third semiconductor layer; and
   a second element isolation region having a depth that terminates prior to reaching the insulating layer and formed in the third semiconductor layer and provided between the first low breakdown-voltage transistor and the second low breakdown-voltage transistor,
   wherein the first element isolation region comprises a trench insulating layer having a dual-trench structure; and
   the first and the second high breakdown-voltage transistors further comprise:
      a first gate insulating layer formed above a channel region; and
      a second gate insulating layer formed of outer edges of the first gate insulating layer and of a second trench insulating layer, and above an offset region,
      wherein a thickness of the second gate insulating layer is greater than a thickness of the first gate insulating layer and the outer edges of the first gate insulating layer are stepped upward from an inner portion of the first gate insulating layer,
      wherein only the first and second high breakdown-voltage transistors are formed in each of the first and second semiconductor layers, respectively.

2. A semiconductor device according to claim 1 further comprising a third element isolation region that reaches the insulating layer and provided between the second semiconductor layer and the third semiconductor layer, wherein the third element isolation region comprises a trench insulating layer having a dual-trench structure.

3. A semiconductor device according to claim 1, wherein the first semiconductor layer, the second semiconductor layer, and the third semiconductor layer have equal thicknesses.

4. A semiconductor device according to claim 1, wherein the first semiconductor layer, the second semiconductor layer, and the third semiconductor layer have equal thicknesses between 500 and 2000 nm.

5. A semiconductor device according to claim 1, wherein the first semiconductor layer, the second semiconductor layer, and the third semiconductor layer have the same surface levels.

6. A semiconductor device, the device comprising:
   a first transistor that includes a first gate insulating film having a first thickness;
   a second transistor that includes a second gate insulating film having a second thickness;
   a first isolation region having a first depth;
   a second isolation region having a second depth;
   a third isolation region having a third depth; and
   a fourth isolation region having a fourth depth,
      the first transistor being disposed between the first isolation region and the second isolation region,
      the second transistor being disposed between the third isolation region and the fourth isolation region,
      each of the first depth and the second depth are being deeper than the third depth,
      the first thickness being greater than the second thickness, and no isolation region being formed between the first isolation region and the second isolation region.

7. The semiconductor device according to claim 6, wherein each of the first isolation region and the second isolation region have a dual-trench structure that includes a first trench and a second trench that has a width that is greater than a width of the first trench.

8. The semiconductor device according to claim 6, further comprising an insulating layer,
   each of the first transistor, the second transistor, the first isolation region, and the second isolation region being formed above the insulating layer, and
   each of the first isolation region and the second isolation region contacting the insulating layer.

9. The semiconductor device according to claim 6, further comprising an insulating layer,
   each of the first transistor, the second transistor, the first isolation region, and the second isolation region being formed above the insulating layer, and
   the third isolation region being not in contact with the insulating layer.

10. The semiconductor device according to claim 6, the first transistor including a third trench region covered by a first gate insulating film of the first transistor.

11. The semiconductor device according to claim 10, the third trench region having a depth equal to the third depth.

12. The semiconductor device according to claim 10, the third trench region and the third isolation region each being formed by an identical process.

* * * * *